US006006351A

United States Patent [19]

Peretz et al.

[11] Patent Number: 6,006,351

[45] Date of Patent: Dec. 21, 1999

[54] ELECTRONIC COMMUNICATIONS SYSTEM AND METHOD

[75] Inventors: Neil M. Peretz; Scott F. Fullam, both of Mountain View; Zong Bo Chen, Sunnyvale, all of Calif.

[73] Assignee: PocketScience, Inc., Santa Clara, Calif.

[21] Appl. No.: 09/003,203

[22] Filed: Jan. 7, 1998

Related U.S. Application Data

[63] Continuation-in-part of application No. 08/588,165, Jan. 18, 1996.

[51] Int. Cl.[6] ............................ H03M 13/00; H04L 1/18; H04M 1/00

[52] U.S. Cl. .................. 714/751; 379/88.13; 379/93.15; 379/93.37; 379/444

[58] Field of Search ................................ 371/32, 33, 34, 371/35; 455/556, 557; 379/444, 88.12, 88.13, 88.14, 88.15, 88.16, 93.01, 93.15, 93.37; 74/748, 749, 750, 751

[56] References Cited

U.S. PATENT DOCUMENTS

| | | | |
|---|---|---|---|
| Re. 32,365 | 3/1987 | Sebestyen | 340/311.1 |
| 3,879,577 | 4/1975 | Progler | 178/23 A |
| 4,584,679 | 4/1986 | Livingston et al. | 714/749 |
| 5,142,550 | 8/1992 | Tymes | 375/206 |
| 5,196,943 | 3/1993 | Hersee et al. | 358/403 |
| 5,509,050 | 4/1996 | Berland | 455/557 |
| 5,568,536 | 10/1996 | Tiller et al. | 455/557 |
| 5,588,009 | 12/1996 | Will | 714/749 |

*Primary Examiner*—Emmanuel L. Moise
*Attorney, Agent, or Firm*—Gray Cary Ware & Freidenrich LLP

[57] ABSTRACT

A system for communicating data between a computer and a unit remote from the computer is provided, comprising receiving input information from a user in the remote unit and for producing data signals corresponding to the input information, producing error corrected message signals from the data signals, generating acoustical tones corresponding to the error corrected message signals, communicating said acoustical tones over a first communications link, said first communications link being bi-directional so that the remote unit communicates data with the computer, and receiving acoustic tones over said first communications link from the computer, the acoustical tones being adjusted for the conditions of the first communication link prior to transmission to the remote unit. The remote unit may also receive data from the computer over a second communications link, which is independent of the first communications link so that the remote unit receives data from two different communications links. A system for communicating a plurality of different types of data between a user and a computer during a single data session is also provided.

34 Claims, 19 Drawing Sheets

18
40
26
22
24
38
36
Computer 20
Modem 28
FAX Output 30
E-mail Output 32
Pager Output 34

100
Keyboard 146
E2 PROM 163
Read
Display 194
EL Backlight 196
EL Driver
ELD 189
CPU 130
ROM 162
RAM 164
136
Filter D/A 148
Amp 150
Speaker 152
Microphone 154
A/D 156
132
150
Drive
Message Waiting LED
Pager 134
158
Receiver 160
Transistor Switch 174
172
rS
AC/DC 168
166
Battery Low Detector 170
138
142 LED
Driver
184
186
188
190
192
30 sec.
1 min.
2 min.
3 min.
3+ min.
140 LED
Send 180
Driver
176
178
Send/Receive 182

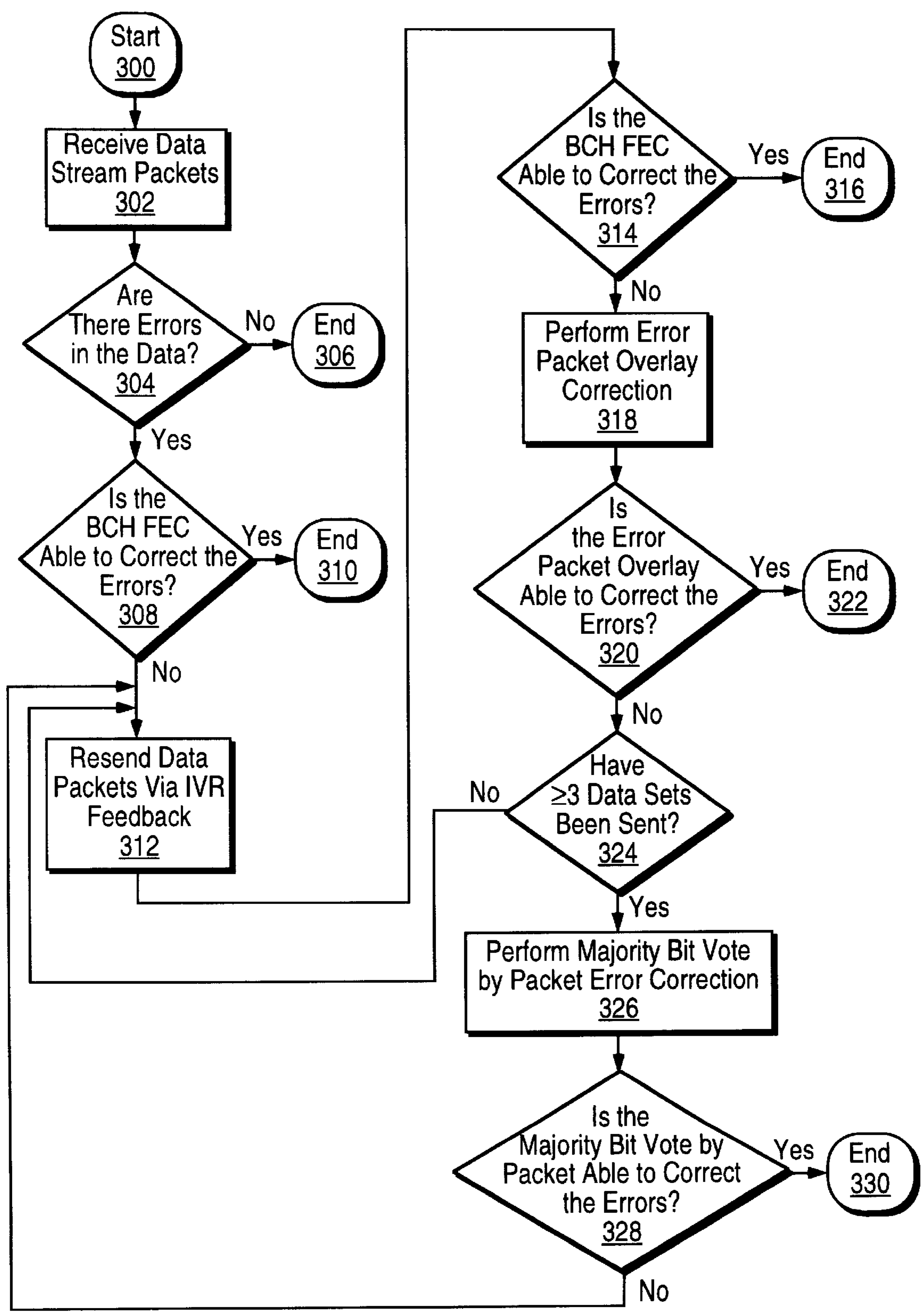
FIG. 14
Start 300
Receive Data Stream Packets 302
Are There Errors in the Data? 304
No
End 306
Yes
Is the BCH FEC Able to Correct the Errors? 308
Yes
End 310
No
Resend Data Packets Via IVR Feedback 312
Is the BCH FEC Able to Correct the Errors? 314
Yes
End 316
No
Perform Error Packet Overlay Correction 318
Is the Error Packet Overlay Able to Correct the Errors? 320
Yes
End 322
No
Have ≥3 Data Sets Been Sent? 324
No
Yes
Perform Majority Bit Vote by Packet Error Correction 326
Is the Majority Bit Vote by Packet Able to Correct the Errors? 328
Yes
End 330
No

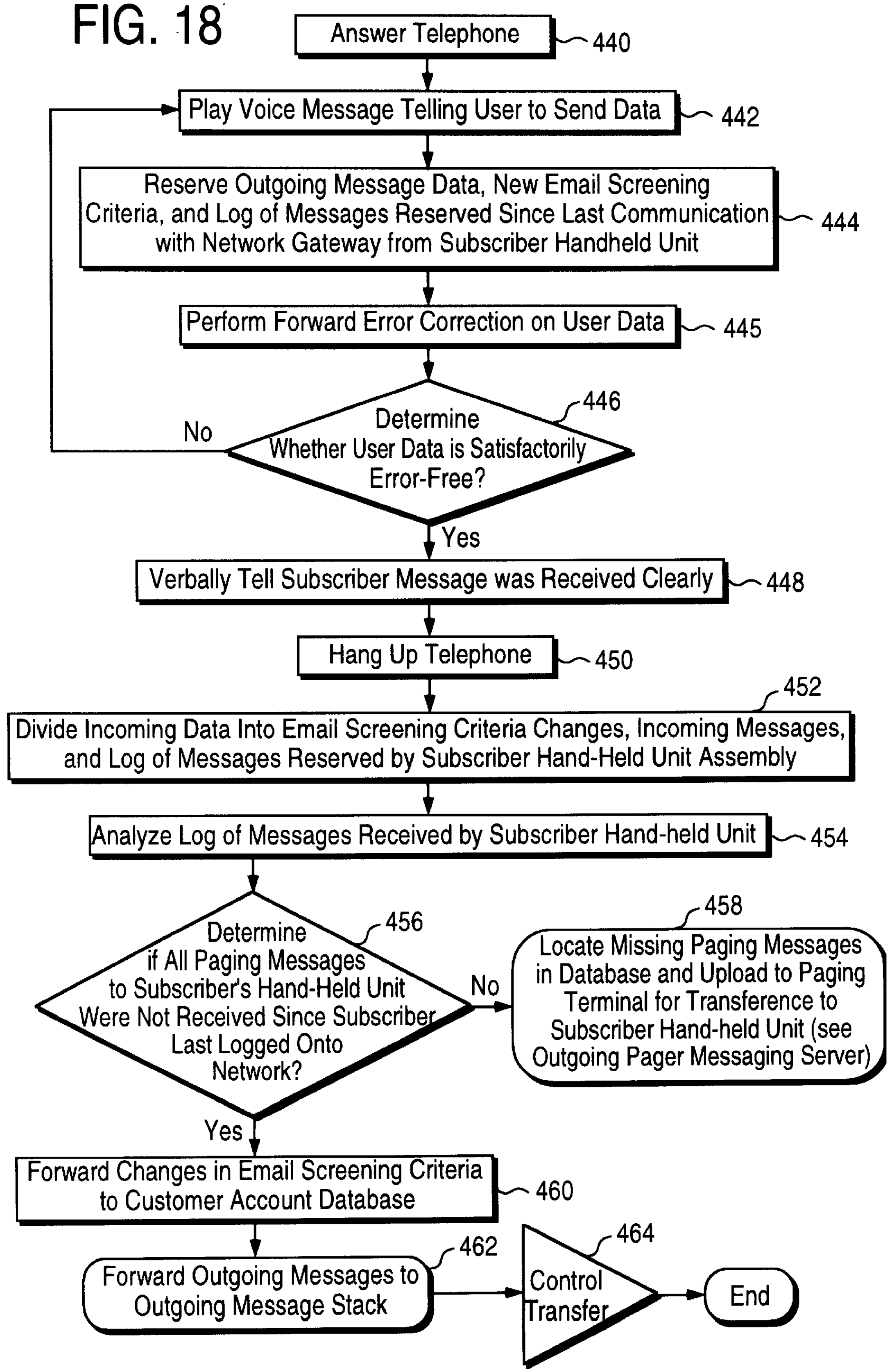
FIG. 18
Answer Telephone
440
Play Voice Message Telling User to Send Data
442
Reserve Outgoing Message Data, New Email Screening Criteria, and Log of Messages Reserved Since Last Communication with Network Gateway from Subscriber Handheld Unit
444
Perform Forward Error Correction on User Data
445
Determine Whether User Data is Satisfactorily Error-Free?
446
No
Yes
Verbally Tell Subscriber Message was Received Clearly
448
Hang Up Telephone
450
Divide Incoming Data Into Email Screening Criteria Changes, Incoming Messages, and Log of Messages Reserved by Subscriber Hand-Held Unit Assembly
452
Analyze Log of Messages Received by Subscriber Hand-held Unit
454
Determine if All Paging Messages to Subscriber's Hand-Held Unit Were Not Received Since Subscriber Last Logged Onto Network?
456
No
Locate Missing Paging Messages in Database and Upload to Paging Terminal for Transference to Subscriber Hand-held Unit (see Outgoing Pager Messaging Server)
458
Yes
Forward Changes in Email Screening Criteria to Customer Account Database
460
Forward Outgoing Messages to Outgoing Message Stack
462
Control Transfer
464
End Voice Mail System 582
Long Distance Calling Card 584
Pocket Mail 586
Switch 580
20
PSTN 72
40
24
100

ELECTRONIC COMMUNICATIONS SYSTEM AND METHOD

RELATED APPLICATION

This application is a continuation in part application of U.S. patent application Ser. No. 08/588,165, filed Jan. 18, 1996.

BACKGROUND OF THE INVENTION

This invention relates generally to a system and method for communicating electronic data, and in particular to a system and method for communicating electronic data in which a portable electronic device transmits data over a telephone line to a central message distribution system. The system may also communicate electronic data using either a one-way communications protocol or a two-way communications protocol and the portable device may receive data from several different sources.

Prior to the proliferation of computers, people communicated store-and-forward style messages (i.e., messages that are first stored in some manner and then later forwarded) using facsimile machines and direct computer-to-computer data connections over existing and leased telephone lines. As computers became cheaper and easier to use, people began using more advanced facsimile machines, computer facsimile modems, and direct computer-to-computer modem connections to transfer information between each other.

More recently, people began to use commercial on-line services to communicate large amounts of store-and-forward style information (i.e., electronic mail) with each other. Now, a new medium for communicating, the Internet, is attaining general public popularity. In the last five years, the number of people connected to the Internet has increased because the Internet allows users who have an Internet account, a modem, and a computer to communicate great amounts of information with each other, regardless of each party's method of accessing the Internet or the geographic location of their Internet access point, at minimal expense. For example, for the cost of a local telephone call, a person in California can send a long electronic mail (e-mail) message to a friend (who also must have Internet access) anywhere in the world. Due in large part to the Internet, the popularity of electronic store-and-forward messaging, such as e-mail, has increased exponentially.

Initially, due to the large size of computers, people typically only accessed the Internet from a desktop computer. Later, as the size and weight of computers decreased from desktops to notebooks to palmtops, people may carry their computer with them wherever they go and access their e-mail account from any location where they could locate a telephone jack to connect, via modem, to the Internet.

At the same time that e-mail was increasing in popularity, paging technology was also increasing in popularity. Many people carry pagers to ensure that others can easily reach them at any time. In addition, a new product category of portable computer, known as a personal digital assistant (PDA) was introduced. The PDA's are basically very small handheld computers (several of which offer limited messaging capabilities, such as paging or e-mail) that are priced too high (i.e., in excess of $500) for purchase by the average consumer and do not offer communication features well-tailored to the average consumer user's needs.

Today, a number of PDA's are on the market. One well-known PDA has a small touch-sensitive screen controlled by special user-interface software. This PDA also has a modem that allows a user to communicate with a computer network and to send e-mail messages, facsimiles, and pager messages. This PDA and its accessories, however, are very expensive, and require that the user locate a phone jack for message transmission and reception. In these well known current PDA systems on the market today, all messages are transmitted and received over the same communications link, which requires an expensive modem and extensive handshaking time between the modem in the PDA and the modem to which the PDA is connected.

A second well known PDA is a cellular telephone with a touch-sensitive backlit display that acts as a keyboard. This second PDA has the ability to send facsimiles, to communicate with commercial on-line services, and to manage a user's schedule with a built-in time management system. This second PDA, however, is also very expensive and too large and heavy to carry around in a user's pocket. In addition, due to this PDA's circuit-switched communications, costs can be very high because it can only communicate over more expensive cellular telephone systems, rather than using less expensive landline telephones and short-burst packet data transmission protocol. In addition, because this PDA relies solely on cellular communications, it has relatively high power consumption, which leads to a very short battery life.

All of the known messaging systems that allow a user to both send and receive multiple types of electronic messages (i.e., facsimile, pager and e-mail) are too large, too expensive, too inconvenient (i.e., they require telephone connectivity through an RJ-11 telephone jack) or drain a battery too quickly. In addition, these known systems cannot send a message reliably over a normal public pay telephone line or many cellular links due to occasional line noise problems that cannot be corrected by known systems, and due to a lack of more convenient (i.e. appropriate acoustic) telephony coupling technology. In addition, none of these known systems provide an inexpensive way to send different types of messages and also provide the user with an audible acknowledgment signal from the receiving computer indicating whether or not the message is sent correctly. These known systems also do not offer two different communications protocols to communicate data or two different systems for receiving messages.

Thus, there is a need for an electronic messaging system that is inexpensive and transmits various types of electronic messages over any type of communications link. There is also a need for an electronic messaging system that has a system for sending an audible acknowledgment signal back to the user and a system for performing multiple levels of error detection and correction. Therefore, there is a need for an electronic messaging system and method that transmits electronic data to a central server over a telephone line and which avoids these and other problems of conventional messaging system and methods, and it is to this end that the invention is directed.

SUMMARY OF THE INVENTION

The invention provides an inexpensive, portable electronic messaging system and method that may be easily acoustically coupled to a communications link, such as a pay telephone handset. It may send any type of electronic messages over a first communications link. The electronic messaging system may also receive incoming messages over the first communications link or a second communications link that is separate from the first communications link.

The electronic messaging system may also send electronic mail, facsimiles, and paging messages using a one-way communications protocol over the same first communications link, through a computer; and allow a user to receive immediate audible feedback, (i.e., a signal acknowledging the receipt of the transmitted data) over the first communications link from the computer. The electronic messaging system may also send messages using a two-way communications protocol in which each transmitted or received data packet may be electronically acknowledged.

The electronic messaging system of the invention also may have a forward error correction scheme that increases the reliability of message transmission over a noisy communications link. The error correction scheme may include multiple levels of error detection and correction to further increase the message transmission reliability. The error correction levels may include data packet level error correction, resending corrupt data packets in response to a corrupt data packet acknowledgment signal from a central computer, and bit level error correction.

The electronic messaging system and method of the invention may comprise a computer and a handheld unit remote to the computer for communicating data between the computer and the remote handheld unit. The remote unit may have a system for receiving input from a user and for producing electrical signals corresponding to the input data. The input data that is converted into electrical signals may also include data which uniquely identifies the particular remote unit and the user to the computer so that the computer can determine which user is sending the input data. The remote unit may also have a system for producing error corrected data based on the electrical signals and for producing acoustical tones corresponding to the error corrected data. The remote unit may also have a system for coupling the acoustical tones to a first communications link for transmission to the computer. The remote unit may also receive acoustical data in a two-way communications protocol.

The computer may have a system for detecting and correcting errors in the data represented by the acoustical tones and a system for sending a signal back to the user of the remote unit over the first communications link to acknowledge receipt of the acoustical tones. The remote unit, in addition, may have a system for receiving data from the computer over a second communications link.

The electronic messaging system also may have a method of error detecting and correcting data in the computer that includes checking data packets for errors, resending any data in which any data packets contain any errors, comparing the data packets to the resent data packets, and comparing each bit in the data packets to each bit in the resent data packets to determine a correct bit. The method may generate an integrity flag, for each data packet, that indicates errors within each data packet.

The electronic messaging system may also transmit data to the server in a one-way or a two-way communications protocol and the handheld unit may have a system for automatically determining which type of communications protocol is being utilized. The electronic messaging system may also have a handheld unit that may balance the load on the CPU to maximize the productivity of the CPU and a system for varying the sampling rate of the receiver depending on the activity of the receiver. The electronic messaging system may also permit a user to, during a single telephone call session, communicate by voice, for example, in responding to voicemails and communicating electronic data, using the handheld unit, over the telephone line during a single communications session.

In accordance with the invention, a system for communicating data between a computer and a unit remote from the computer is provided, comprising receiving input information from a user in the remote unit and for producing data signals corresponding to the input information, producing error corrected message signals from the data signals, generating acoustical tones corresponding to the error corrected message signals, communicating said acoustical tones over a first communications link, said first communications link being bi-directional so that the remote unit communicates data with the computer, and receiving acoustic tones over said first communications link from the computer, the acoustical tones being adjusted for the conditions of the first communication link prior to transmission to the remote unit.

A system for communicating data between a computer and a unit remote from the computer is also provided, comprising receiving input information in the remote unit from a user and for producing data signals corresponding to the input information, producing error corrected message signals from the data signals, generating acoustical tones corresponding to the error corrected message signals, communicating said acoustical tones over a first communications link, said first communications link being bi-directional so that the remote unit communicates data with the computer, and receiving data from the computer over a second communications link, which is independent of the first communications link so that the remote unit receives data from two different communications links.

A system for communicating a plurality of different types of data between a user and a computer during a single acoustical data session is also provided, comprising receiving an incoming call from a user, receiving acoustical tones from said user, and switching between a plurality of acoustical sessions based on said received acoustical tones during a single acoustical data session, said plurality of acoustical sessions comprising a voice mail session and an electronic data communications session so that the user may communicate voice data and electronic data acoustically to a computer during a single data session. In addition, a device for acoustically communicating electronic data with a computer is provided, comprising: a case having an open position and a closed position, an input device, exposed when said case is open, to permit a user to enter data, and a display device, exposed when said case is open, to display data to a user. The device may further include a communications system located on an outer surface of the case for communicating electronic data with the computer, a system for activating said communications system when said case is closed, a system for determining a time period for said electronic data communication session, and a system on the outer surface of the case for indicating the time period of the communication session so that the user may initiate and complete the communications session with said case in the closed position. The remote unit may further include au audio transducer which generates a beeping sound during a data communication session so that the user can verify the communications session is occurring even if there is loud background noise.

BRIEF DESCRIPTION OF THE DRAWINGS

FIG. 14 is a flowchart of a forward error correction method in accordance with the invention;

FIG. 18 is a flowchart depicting a one-way transmission method in accordance with the invention;

DETAILED DESCRIPTION OF A PREFERRED EMBODIMENT

The invention is particularly applicable to a system and method for communicating electronic data between a handheld unit and a central server over an ordinary telephone line. It is in this context that the invention will be described. It will be appreciated, however, that the system and method of the invention has greater utility.

The electronic messaging system in accordance with the invention may include a computer, and a hand-held, portable, battery powered unit. The unit may be located remotely from the computer and may generate, transmit and/or receive electronic messages, such as pager, facsimile, and e-mail messages, over a first communications link to the computer, and may also receive incoming messages from the computer over a second communications link. The remote unit may also have a display device and an input device for creating and viewing messages. In addition, the remote unit may have an acoustic coupling system so that signals from the remote unit may be acoustically coupled to and communicated through the first communications link. The computer of the electronic messaging system may receive the incoming remote unit electronic messages, may detect and correct errors in remote unit signals, and may transmit an audible signal or electronic signal back to the user of the remote unit, over the first communications link, indicating receipt of the remote unit signals. The computer may also transmit the various types of electronic messages from the remote unit (i.e., e-mail, pager, and facsimile) over various appropriate outputs, and may transmit messages back to the remote unit over a second communications link.

The remote unit may communicate with the computer using either a one-way communications protocol or a two-way communications protocol and the computer may automatically determine which communications protocol is going to be used. During the one-way protocol, the remote unit may transmit data to the computer and the computer, at the end of an entire communications session, may send an audible signal back to the user acknowledging receipt of the messages or requesting that the messages are resent. During the two-way protocol, the remote unit and the computer may electronically communicate with each other so that the remote unit may transmit each data packet and the computer may acknowledge each data packet or request that the data packet is resent. Either protocol may be utilized depending on the telephone line conditions or the alignment of the remote unit with the telephone handset, as described below.

Figure 1:
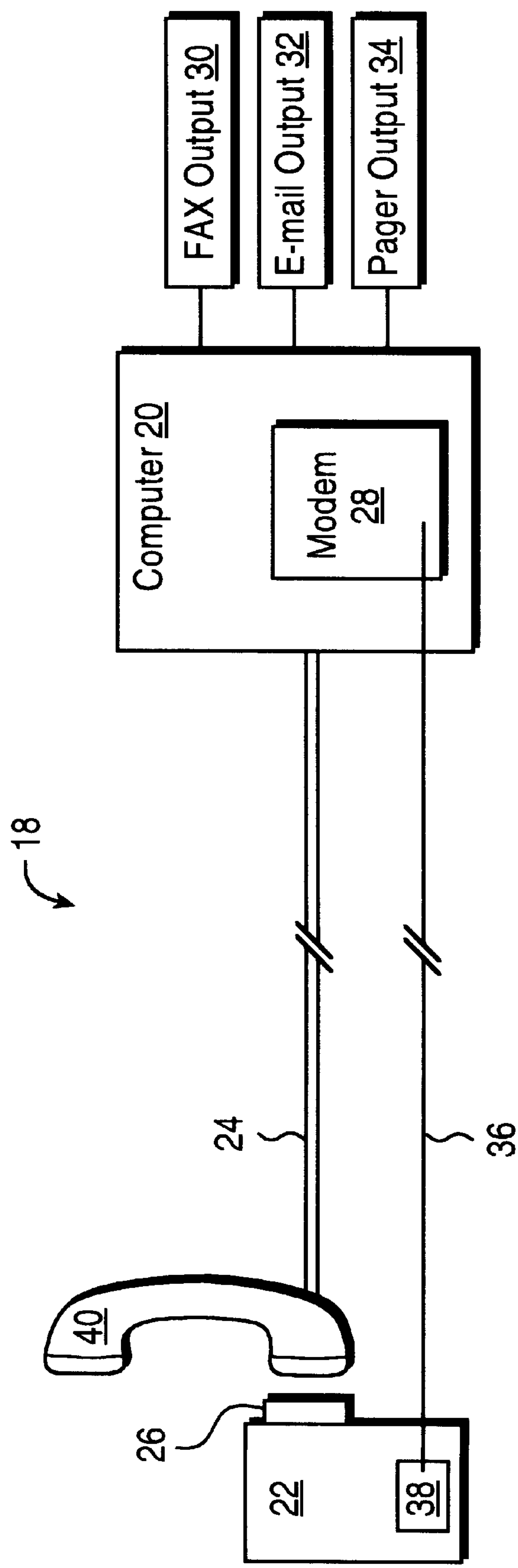
FIG. 1 is a diagram depicting an embodiment of an overall system and method for communicating electronic data between a handheld unit and a server over a telephone line in accordance with the invention

FIG. 1 is a schematic diagram of an electronic multifunction messaging system 18 embodying the invention. As shown, the electronic messaging system 18 may include a computer 20, and a portable unit 22 remote to the computer. A first communications link 24, such as an ordinary telephone line, may connect the remote unit 22 to the computer 20 to permit the communication of messages from the remote unit to the computer using either a one-way or a two-way communications protocol. The remote unit preferably generates acoustic tone patterns (V.23 CCITT originating station modem tone frequencies to indicate a serial 1/0 bit stream) representing various types of electronic messages created by a user. In the one-way protocol, the acoustic tones may be output by an output device 26, such as a speaker, and transmitted over the first communications link to the computer, which interprets the tones from the remote unit using a data receiver modem 28, that is described below in more detail. The computer may detect and correct errors in the data, as described below, sent to it by the remote unit, and may generate an audible signal that is sent back to the user of the remote unit over the first communications link. The signal may indicate a sufficiently error-free data transmission or may indicate that the data must be resent because the transmission is not sufficiently error-free. In the two-way protocol, a microphone (not shown) may also be coupled to the remote unit so that the computer may transmit acoustical tones back to the remote unit to acknowledge each packet of data.

The computer may separate out the individual types of messages according to their ultimate destination (i.e., facsimile, e-mail, and pager messages), and send those messages to the appropriate sub-system within the computer that transmits the messages (i.e., a facsimile machine subsystem for transmission of facsimile messages). In the system shown in FIG. 1, the computer may have a facsimile output 30, an e-mail output 32 and a pager output 34. The multi-function electronic messaging system according to the present invention may process any other type of electronic messages and may also have additional types of functions, such as a voice messaging system. The computer may also send incoming electronic messages to the remote unit over the first communication link in a two-way communications protocol and/or over a second communications link 36, as will be described below.

The computer may also detect faulty pager messages or pager messages not received by the handheld unit, based on a telephone session with the handheld unit, and the computer may re-transmit those lost pager messages either over the pager frequency or over the telephone link. The computer may also permit the user to customize his communications with the computer so that the computer may provide additional information to the user about the origin of an incoming message. For example, the computer may receive an incoming facsimile message for a user and may retrieve, from a copy of the user's address book stored on the computer, the sender of the facsimile message and determine the sender's facsimile number so that the user may easily respond to the facsimile message. The computer may then attach the sender's facsimile number to the facsimile message and transmit both to the user over one of the communications links. Therefore, when the user receives the message, he will may the return facsimile number so that he can respond without having to look up the facsimile number in his address book. The computer may also attach a person's phone number to an incoming voicemail message so that the user may more easily respond to the message.

The user may also request that a complete copy of the data stored in the handheld unit is periodically stored on the computer. For example, an address book and any saved messages may be stored on the computer. In the event that the handheld unit loses its data due to low battery power, the data may be restored to the handheld unit from the copy stored on the computer. In addition, if a user loses his handheld unit or the handheld unit is stolen, the user may purchase a new handheld device and restore all of his data from copy of the data stored on the computer.

The separation of the first communication link for communicating data from the second communications link for only receiving data provides many advantages. In addition, the one-way and two-way protocols also provide advantages. In particular, the first communications link in the one-way protocol is used solely for unidirectional transmission of messages from the remote unit (i.e., send-only, with no handshaking between the computer and the remote unit), in packet form, and the second communications link is used solely for unidirectional transmission of messages from the computer to the remote unit (i.e., receive-only, with no handshaking between the computer and the remote unit), in packet form as well. This unidirectional transmission of packetized messages may be faster than traditional bi-directional transmission because the bi-directional transmission requires handshaking and greater synchronization between the remote unit and the computer. The unidirectional transmission also may maximize the use of the most convenient communications link for time-sensitive messages from the computer to the remote unit, and may use more affordable bandwidth for the transmission of messages from the remote unit to the computer. The two-way protocol option provides a user an additional choice, such as when the second communications link may be inoperative. For example, a pager receiver will not operate in an airplane flying at its typical cruising altitude, but a specially dedicated cellular phone will operate so a user may receive and transmit data from an airplane in accordance with the invention.

In this embodiment, the second communications link may be a wireless pager frequency link. To receive the incoming pager messages, the remote unit may have a pager receiver 38. In addition, the first communications link may be a pay telephone line with a receiver handset 40, and the remote unit speaker is held against the telephone handset microphone to couple the acoustical tones to the telephone line. The first and second communications links may be any type of communications link, and are not limited to the examples shown in FIG. 1.

Figure 2:
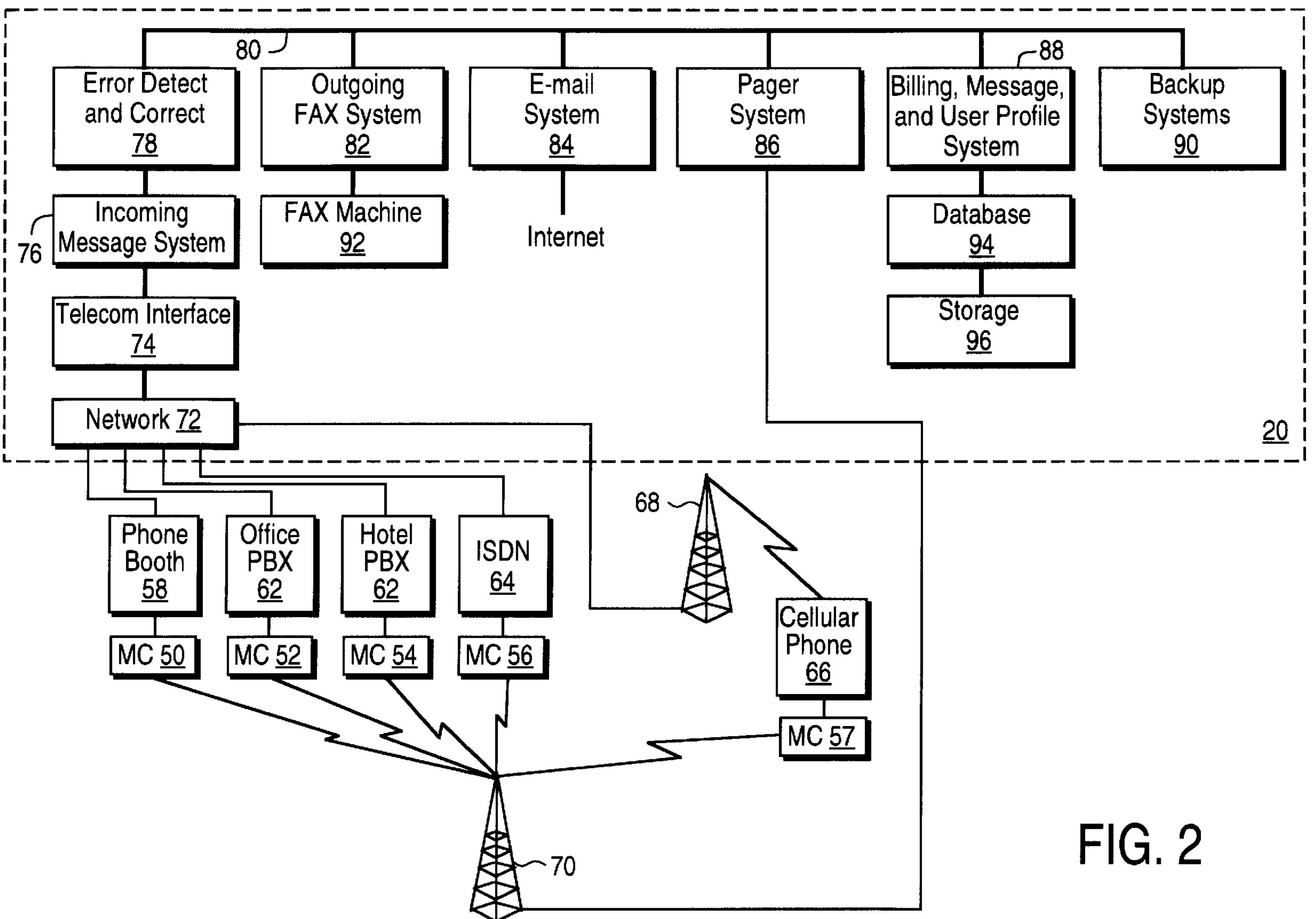
FIG. 2 is a diagram depicting a plurality of handheld units communicating data with a server in accordance with the invention.

FIG. 2 is a block diagram of the computer 20 connected to a plurality of remote units 50, 52, 54, 56 and 57. The remote units may be connected to the computer, as shown, through a variety of different first communication links, such as a public telephone line 58, an office private branch exchange (PBX) 60, a hotel telephone switchboard and branch exchange 62, an ISDN link 64, or a cellular telephone link 66 through a cellular base station 68. In addition, as described above, the remote units may also have a built-in or external pager radio receiver (not shown), so that the remote units may receive incoming pager messages over the second communications link, such as radio pager system 70. All of the remote units attached to the different first communications links, are connected to the computer by a Public Switched Telephone Network (PSTN) 72 that may handle a plurality of telephone calls from remote units by switching the calls to various incoming telephone lines and a plurality of modems (not shown) in the computer. The modems may be connected to a telecommunications interface 74 of the computer that interprets and translates (converts) the incoming acoustical tones from the remote units into electronic digital form. The telecommunications interface may then forward the converted incoming remote unit data to an incoming message system 76 that processes the incoming data from the remote units. The detection and correction of errors in the data may be performed by an error detection and correction system 78. The error-corrected messages may be routed to the appropriate outgoing message systems, as described below. The operation of the incoming message system will be described below with reference to FIG. 19. All of the computer systems may include microprocessors or multi-tasking computer servers and may be connected together by a backbone network 80, such as an Ethernet network, so that all of the systems within the computer may exchange data with each other. In this embodiment, the outgoing message systems shown are an outgoing facsimile system 82, an e-mail system 84, and a pager system 86. A billing, message and user profile system 88, and a backup system 90 may also be connected to the backbone 80. The invention is not limited to the outgoing systems shown and may have other systems, such as a voicemail system.

If some of the data received by the incoming message system 76 is a facsimile message, then the message may be first error detected and corrected in the error detection and correction unit 78 and then routed over the backbone network 80 to the outgoing facsimile system 82, that may have a facsimile machine 92 or server attached to it for sending outgoing facsimile messages. If some of the data received by the incoming message system is an outgoing electronic mail (e-mail) message, the message may be error-corrected and routed to the e-mail system 84, and then over an electronic mail channel, such as the Internet. For an incoming e-mail message to the remote unit user, the e-mail message is received by the e-mail system and routed in a one-way protocol to the pager system 86, which sends the message to the remote unit through a paging terminal and transmitter 70 in the form of a pager message. In a two-way protocol, the incoming message may be communicated over the first communications link to the remote unit. Thus, there are two different ways to transmit messages to the remote unit. If some of the data received by the incoming message system is an outgoing pager message, then the message may be routed to the pager system 86 that is connected to the paging terminal and transmitter 70.

The billing, message and user profile system 88 may store all of the information necessary to keep track of billing, message usage, and user profiles. The billing, message and user profile system may also have a database 94 and an archival storage device 96, for short term and long term storage, respectively, of the user profiles and billing information. The database also stores audible messages (i.e., prerecorded voice messages) that may be sent to the user of the remote unit user over the first communications link (i.e., as an acknowledgment that data from the remote unit has been properly received). The back-up system 90 may include a back-up facsimile system, a back-up e-mail system, a back-up pager system, a back-up incoming Message system and a back-up billing, message and user profile system that are all connected together by a back-up network. The details of the back-up system are not shown. This back-up system provides redundancy within the computer to reduce lost data due to crashes and other possible malfunctions and mishaps. Now, the handheld unit in accordance with the invention will be described in more detail.

Figure 3:
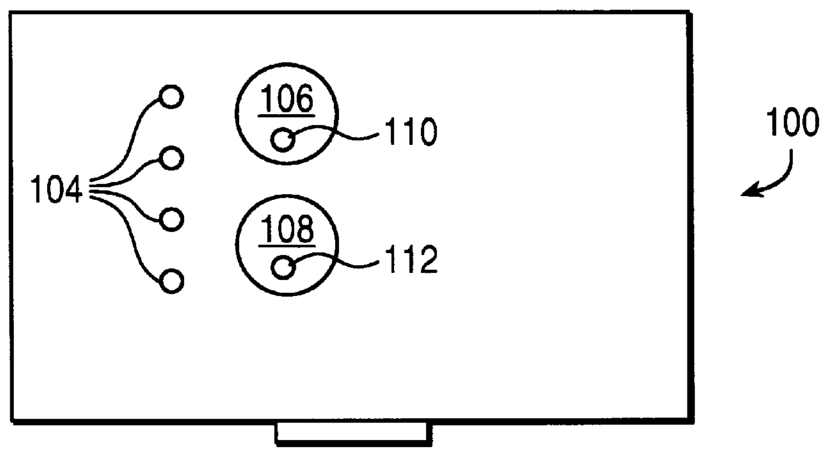
FIG. 3 is a top view of a handheld unit in accordance with the invention in a closed position.
Figure 5:
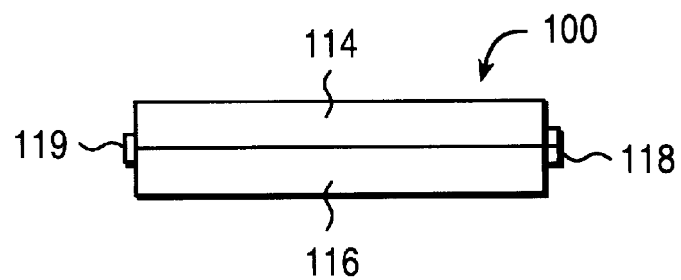
FIG. 5 is an end view of a closed handheld unit in accordance with the invention.
Figure 6:
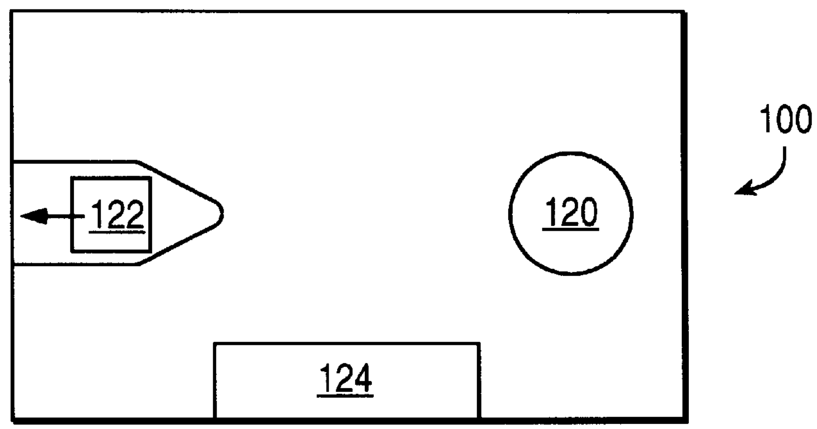
FIG. 6 is a bottom view of a closed handheld unit in accordance with the invention.
Figure 7:
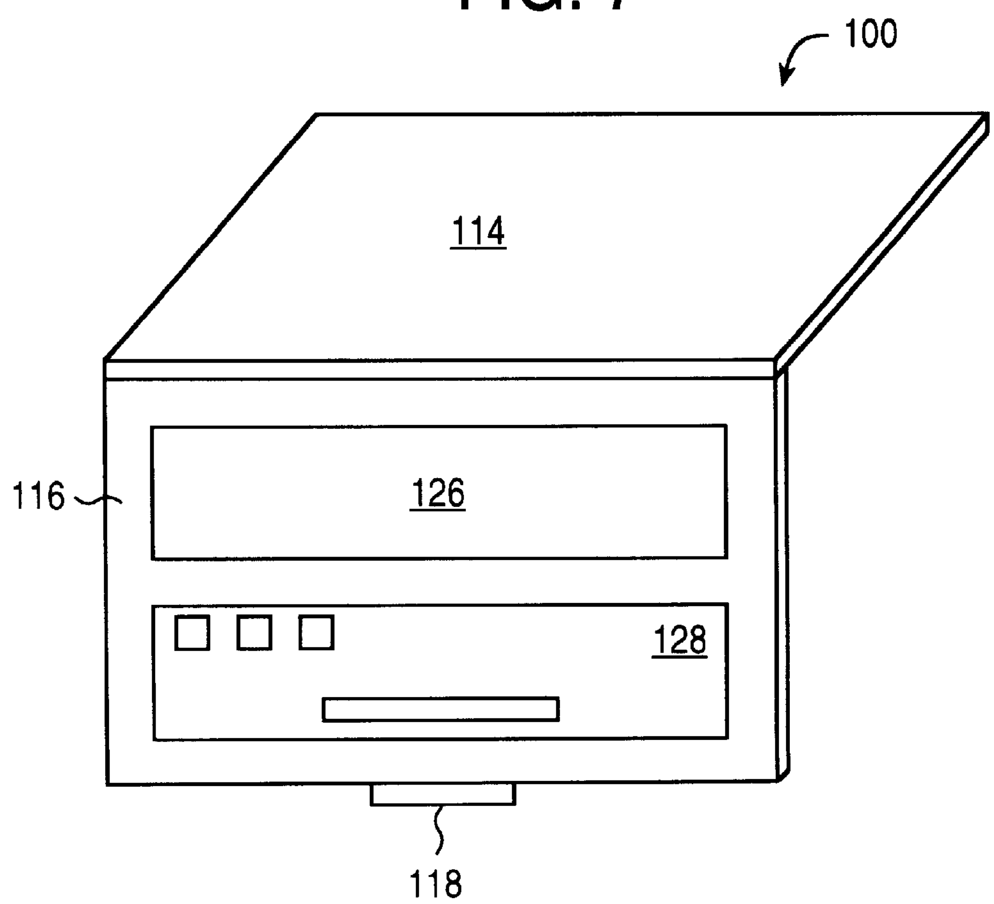
FIG. 7 is a top view of a handheld unit in accordance with the invention in a open position.

FIGS. 3–6 are top, side, end, and bottom views, respectively, of a closed handheld unit in accordance with the invention and FIG. 7 is a top view of an open handheld unit in accordance with the invention. A handheld unit 100 may be sized such that the handheld unit fits easily into a pocket for convenient carrying. As shown in FIG. 3, when the handheld unit 100 is closed a top surface of the case 102 is viewed and the top surface of the case may include a plurality of light emitting diodes (LED's) 104 and two buttons 106, 108. Each button may have an LED 110, 112 associated with the button. The LED's 104 and the buttons 106, 108 permit the handheld unit to be operated with the case closed, as will be described below. The LED's 104 may indicate the length of time required for the transmission of messages to the handheld unit, as described below. The first button 106 may permit the user of the handheld unit to select a "Send-only" mode of operation as described below. The LED 110 will illuminate to indicate that the messages are being received by the handheld unit. The second button 108 may permit the user to select a Send/Receive mode of operation and the LED 112 may illuminate to indicate that the messages are being received by the handheld unit. These two buttons permit a user to operate the handheld unit without opening the case. Thus, a user may want to quickly check his messages may do so by simply holding the speaker of the handheld unit up to the telephone handset and depressing the appropriate button, as will be described below in more detail.

In order to ensure that a user of the handheld unit can determine that an active communications session between the handheld unit and the server is occurring, the handheld unit may have an audio transducer. During an active communications session, the audio transducer may emit a constant beeping sound so that, even if the user cannot hear the acoustical data due to high background noise, the user may confirm that communications session is occurring.

Figure 4:
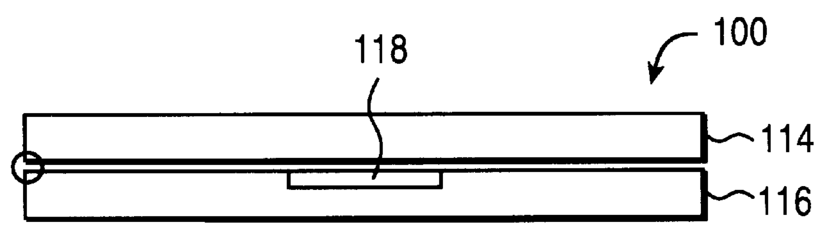
FIG. 4 is a side view of a closed handheld unit in accordance with the invention.

FIGS. 4, 5 are diagrams of a side and end view, respectively, of the handheld unit 100. As shown, the handheld unit may have an upper case 114 and a lower case 116 that may be releasably closed by a latch 118. The handheld unit may also have a hinge 119 that connects the upper and lower cases. As shown in FIG. 6, the bottom of the handheld unit may also have a speaker 120 and a microphone 122. The speaker and the microphone may be separated by a distance on the handheld unit such that the speaker and microphone may acoustically couple to the earpiece and mouthpiece, respectively, of a telephone when the handheld unit is being operated in the two-way mode of operation, as described below. The microphone location may be adjustable to adjust for different telephone handsets. The bottom of the handheld unit may also have a battery compartment 124. FIG. 7 is a diagram of the handheld unit 100 when the case is open. As shown, a display 126 and a keyboard 128 may be protected by the upper case 114 when the case is closed. Now, the handheld unit will be described in more detail.

Figure 8:
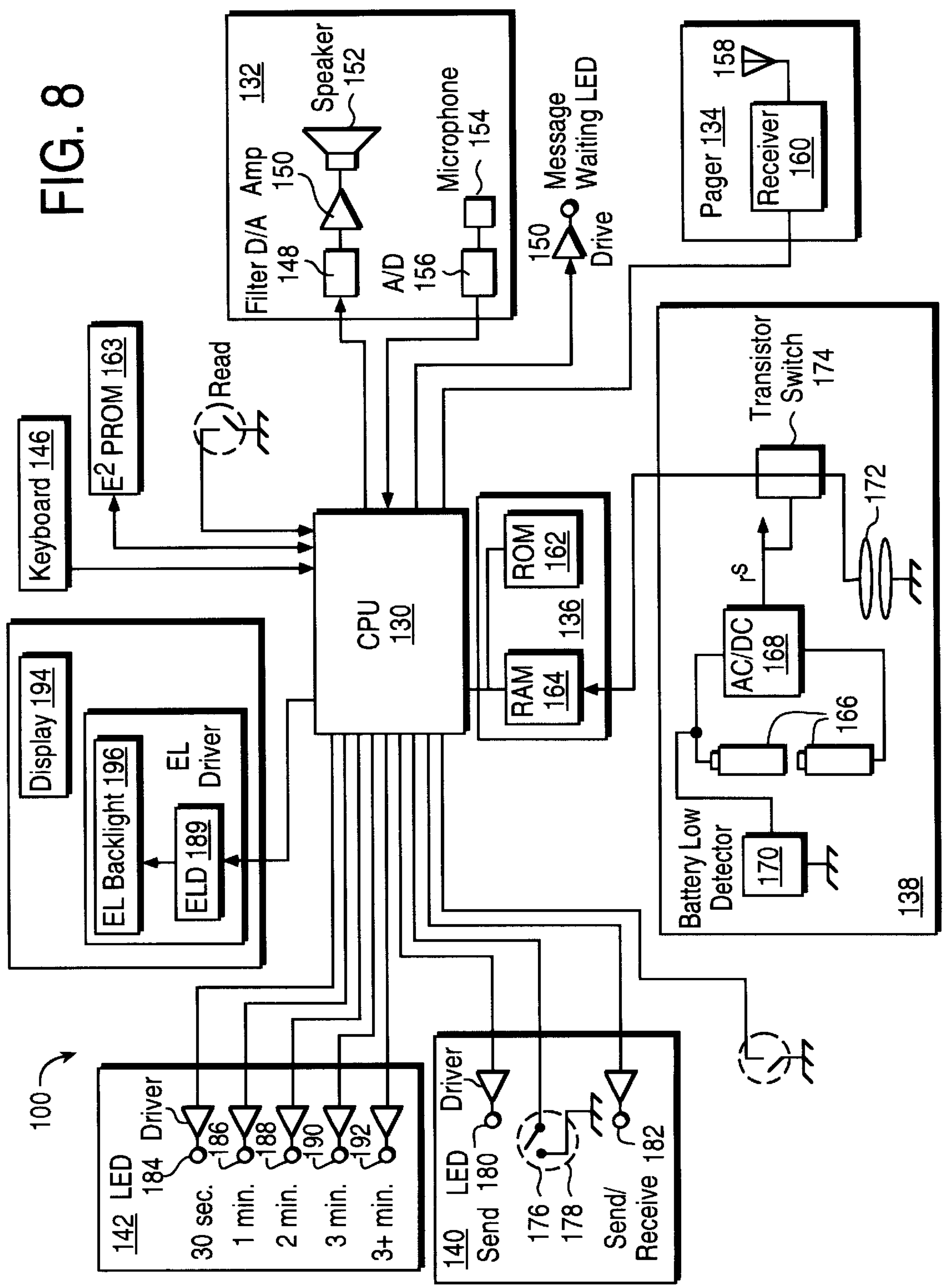
FIG. 8 is a more detailed diagram of the handheld unit in accordance with the invention.

FIG. 8 is a more detailed block diagram of the handheld unit 100 in accordance with the invention. The handheld unit may include a central processor unit (CPU) 130, a communications unit 132, a pager unit 134, a memory unit 136, a battery unit 138, a mode selector 140, a communications length indicator 142, a display system 144, and a keyboard 146. The CPU may control the various other pieces of the handheld unit. The communications unit may permit the CPU and the user to send and/or receive electronic data over a telephone line, and the pager may receive data over a pager frequency. Thus, in accordance with the invention, there may be two different methods for receiving electronic data (i.e., over the telephone line or over the pager frequency). The memory may store the software application being executed by the CPU and store user data, such as addresses, appointments and the like. The battery system may provide power to the electronic messaging system and ensure that a portion of the memory always receives power in order to avoid losing the user's data, for example, when the batteries need to be changed. The mode selector may permit the user to select a send-only mode or a send/receive mode. The communication length indicators permit the user to quickly determine the time necessary to download the messages over the telephone line. The communications length indicator may also indicate to the user that he may break the communications link with the server, as described below, without any permanent loss of data. As soon as the communications length indicator has illuminated, a summary of all of the messages to be sent to the handheld unit has been received so that if the communications link is broken before all of the messages have been transferred to the handheld unit, the handheld unit may later request the messages that were not sent based on the summary. The display system displays data for the user to view, and the keyboard permits the user to enter data into the handheld unit. The keyboard may be replaced with a touchscreen and handwriting recognition software.

The handheld unit may transmit a message to the server indicating, at the start of the communication session, how much memory space remains in the handheld unit for messages. Thus, the server will only send as many messages as can fit in the memory to avoid causing the handheld unit to lose older messages. The server may also send a message to the user indicating that the user needs to remove messages before any additional messages will be transmitted from the server.

The communications system 132 will now be described in more detail. The communications system may a send electronic data using a filter/digital to analog converter (D/A) 148, an amplifier 150 and a speaker 152. The CPU may generate forward error corrected (FEC) digital pulse width modulated audio data that is converted into an analog waveform. The analog waveform may be amplified and the amplified analog signals cause the speaker to generate audio signals that may be communicated over a telephone line in accordance with the invention. To communicate the Audio signals over the telephone line, the speaker may be acoustically coupled to the telephone handset mouthpiece. The communications system may also receive FEC encoded data over the telephone line using a microphone 154 and an A/D converter 156. To receive data over the telephone line, the microphone may be acoustically coupled to the telephone handset receiver. Thus, in accordance with the invention, the handheld unit may both transmit and receive data in the form of Audio signals over the telephone line. The pager receiver will now be described.

The pager receiver 134 provides a second way in which data may be transmitted to the handheld unit. The pager receiver may receive pager transmissions using a pager antennae 158 and a pager module 160 that converts the received pager frequency signals into data that may be routed to the CPU. Thus, with the handheld unit, the user may receive data using the two-way protocol over the telephone line or over the pager frequency, depending on the set-up selected by the user. For example, the user may select to receive a summary of his incoming messages over the pager as a pager message so that he may review and select the messages that will be downloaded to him over the telephone line, which may reduce the time needed to download the message. The user may also select to download only critical messages. The user may also select to receive his pager messages over the first communications link (i.e., the telephone link) which provides back-up to the pager receiver in the event that the pager receiver is inoperative. The user may also select to receive his messages over the pager instead of the telephone link which provides back-up to the telephone link. The handheld unit may also be operated without a pager module.

In operation, the messages received over the pager may be tracked by the server so that any lost pager messages may be re-transmitted over the pager or over the telephone link. For example, the server may send a plurality of pager messages to the handheld unit and each of these pager messages may be marked with an identifier. As the handheld unit receives the pager messages, it may record the identifiers so that it can determine if a message was lost. For example, the handheld unit may determine that it received pager messages 1–4 and 6–10, but not pager message 5. At some later time when the handheld unit connects to the server over the telephone link, the handheld unit may request that the server resends pager message 5 based on the identifiers. Thus, the system may track incoming pager messages and request re-transmission of lost pager messages.

When a pager message is transmitted to the handheld unit, a large pager message may be split into several smaller pager messages. For example, a one thousand character message may be divided into five 200 character messages because the maximum message size of a typical paging system may be two hundred characters. In a typical pager system, the message may be divided into several smaller messages, but the message is not put back together into the large message so that the user must read each part of the message as a separate message. The computer, in accordance with the invention, may spilt a large message into several smaller message segments and may also attach a flag to each message segment. When all of the parts have been received by the handheld unit, the handheld unit may, using the flags attached to each segment, reconstruct the large pager message so that the user may read the entire large message without reading the several message segments. The flags attached to each message segment may also permit the handheld unit to determine that a portion of the larger message was corrupted or not received and request re-transmission of the corrupted message segment. Now, the memory and the battery systems of the handheld unit will be described.

The memory 136 may include a read only memory (ROM) 162, a electrically erasable, programmable read-only memory (EEPROM) 163 and a random access memory (RAM) 164. The memory 136 may also have a flash memory card (not shown) that may be added on to the handheld unit to increase the storage capacity of the handheld device. The ROM may store the applications, such as the message organizer, address book application, and the datebook, that are permanently stored within the handheld unit. The EEPROM may store data that may be changed once at the factory, such as a handheld unit's serial number that may be used by the server to identify each handheld unit. The RAM may store a user's changing data, such as address book data, sent messages, appointments and the like. Since RAM is volatile and its contents will be lost if power is lost to the RAM, the battery system 138 provides constant power to the RAM. To avoid completely losing his data, a user may back-up all of his data to the server and then, if he does lose his data, he may download his previously stored data from the server and rebuild his data on his handheld unit. The battery system 138 may provide power to the CPU and the rest of the system, but especially provides power to the RAM. The battery system may include a pair of non-rechargeable batteries 166, and a converter 168 which outputs a steady +5 volts. A low battery indicator 170 may also be included in the battery system 138. To back-up the non-rechargeable batteries, a pair of alkaline cells 172 may be included that are not used unless the non-rechargeable cells have been depleted or removed from the handheld unit. A switch 174 may switch between the non-rechargeable cells 166 and the alkaline cells 172 to ensure the power is maintained to the RAM. Now, the mode selection system 140 and the communication length indicator system 142 will be described.

The mode selection system 140, as described above, permits a user to select either a send-only mode for faster message transfer or a send/receive mode. To select either mode, the user may depress a button 176, 178 for the send mode or the send/receive mode and an LED 180, 182 associated with each button will illuminate to indicate the mode of operation selected by the user. As described above, the buttons and LED's may be located on the outside of the handheld unit so that it may be operated without opening the case. The transmission length indicator system 142, as described above, may comprise a plurality of LED's 184–192 which indicate the length of time required to receive the messages from the server. As shown, the length may be indicated to be 30 seconds, one minute, two minutes, three minutes or more than three minutes. The LED's may also indicate a percentage of time remaining in the communications session, such as 75%, 50% and 25%. In addition, once any one of the LED's has been illuminated, the handheld unit has received a condensed summary of the messages to be received by the handheld unit, as described below. Thus, if the communications link is broken prior to receiving all of the messages, the user may later request the transmission of those unsent messages based on the summary of the messages so that the user may break the communications link with the server, after the summary is received, without permanently losing any of the messages. Now, the display and keyboard will be described.

The display 144 may include a liquid crystal display (LCD) 194, an electroluminescent (EL) backlight 196 and an EL driver 198. The EL backlight may backlight the LCD so that the LCD may be viewed easily during low light conditions. The keyboard 146 may be a standard QWERTY layout keyboard. Now, the operation of the handheld unit will be described.

In operation, a user may either transmit messages to the server or receive messages from the server. To transmit messages, a user may generate a message using a keyboard and the message may be stored in the RAM. The user may then establish a telephone link with the server. The user may then hold the speaker and/or microphone of the handheld unit up to the handset of the telephone. The server may then determine whether the communication is one-way (i.e., the handheld unit sends data and the server sends voice prompts back to the user) or two-way (i.e., the handheld unit or server sends/receives packets of data and the handheld unit or server may acknowledge the receipt of each packet). The one-way and two-way mode of communication will be described below in more detail. With either one-way or two-way, the data from the handheld unit may be transmitted over the telephone line to the server. The user may then hang-up the telephone once the message transfer is complete.

To receive data from the server, the user may either receive data over the telephone line if the send/receive mode of operation has been selected, or over the pager receiver. For the pager receiver, the user may receive pager messages at any time. To receive messages over the telephone line, the user must initiate a telephone call to the server and the data will be downloaded. As described above, the server may send a pager message to the user containing a summary of the incoming messages so that the user may select to download only certain messages. The communications system located on the server for communicating with the handheld unit will now be described.

Figure 9:
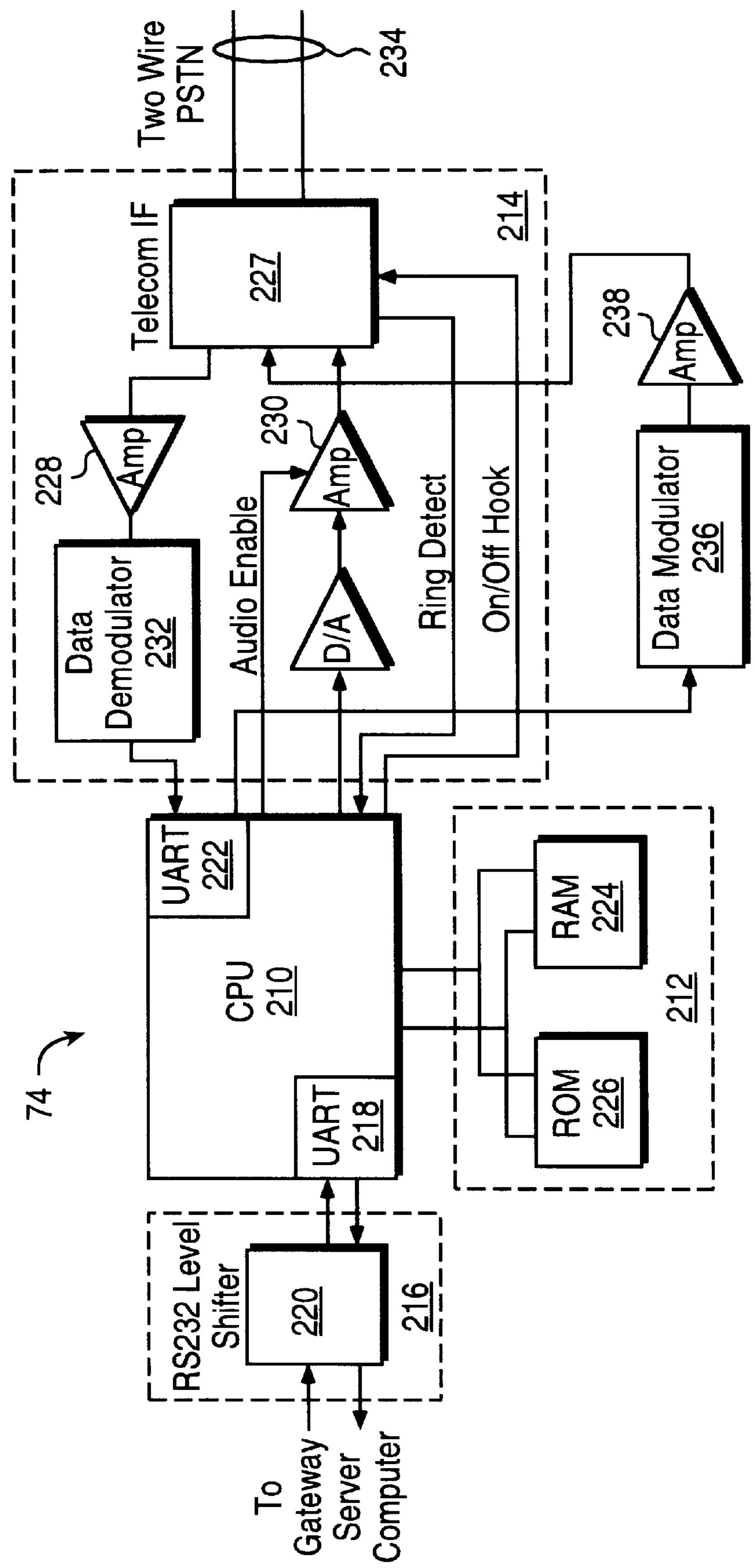
FIG. 9 is a diagram illustrating a communications system located on the server for communicating with the handheld unit.

FIG. 9 is a detailed block diagram of the telecommunications interface 74 that is part of the data receiver modem 28, shown in FIG. 1. The modem may include a modem CPU 210, a memory unit 212, a message transceiver 214, and an incoming message system interface 216. The modem CPU may have a first UART port 218 that communicates with the incoming message system interface, such as an RS232 level shifter 220 to communicate data back and forth between the incoming remote unit server and the data receiver modem. A second UART port 222 in the CPU connects to the message transceiver for receiving remote unit data (acoustical tones), transmitting a signal acknowledging receipt of the remote unit data back to the user of the remote unit over the first communications link and transmitting messages in the form of acoustical tones from the server back to the handheld unit.

The memory unit 212 may have a RAM 224 that may act as a buffer for the incoming electronic messages and may temporarily store program information and variables, such as the set-up information for each particular remote unit. The memory unit may also have a ROM 226 for storing software programs that run on the modem CPU. The incoming data from the remote unit and outgoing acknowledgment signals to the user of the remote unit go through the message transceiver that may include a telecommunications interface 227, a first and second amplifier 228, 230, and a data demodulator 232. The incoming data from the remote unit may be carried over the first communications link (not shown) to another communications network, such as a Public Switched Telephone Network (PSTN) 234, or the first communications link itself may be the PSTN. The incoming tones are converted to electrical signals by the telecommunications interface 227, amplified by the first amplifier 228, demodulated by the data demodulator 232, and enter the modem CPU through the UART port. For outgoing acknowledgment signals sent out over the PSTN and any other first communications link, the modem CPU signals another sub-system (not shown) within the computer to generate a signal, such as a synthesized or pre-recorded audio message. The modem CPU also controls this signal by controlling the enabling signal to the second amplifier 230. Thus, the signal is fed into the second amplifier, through the telecommunications interface, and transmitted over the PSTN 234 or any other first communications link back to the user of the remote unit. The telecommunication interface 227 is controlled by an ON/OFF hook signal (the phone line is switched between on and off hook conditions) generated by the modem CPU. An incoming ring condition from the PSTN generates a ring detect signal that is fed into the modem CPU, causing the modem CPU to activate the telecommunications interface.

For an outgoing message from the server to the handheld unit, the CPU 210 may generate the appropriate electrical signals that may be modulated by a data modulator 236 and amplified by an amplifier 238. The amplified acoustical tones may then by routed through the telecommunications interface 227 and sent over the PSTN 234 to the handheld unit. Now, the one-way and two-way communication protocol between the handheld unit and the server will be described.

Figure 10:
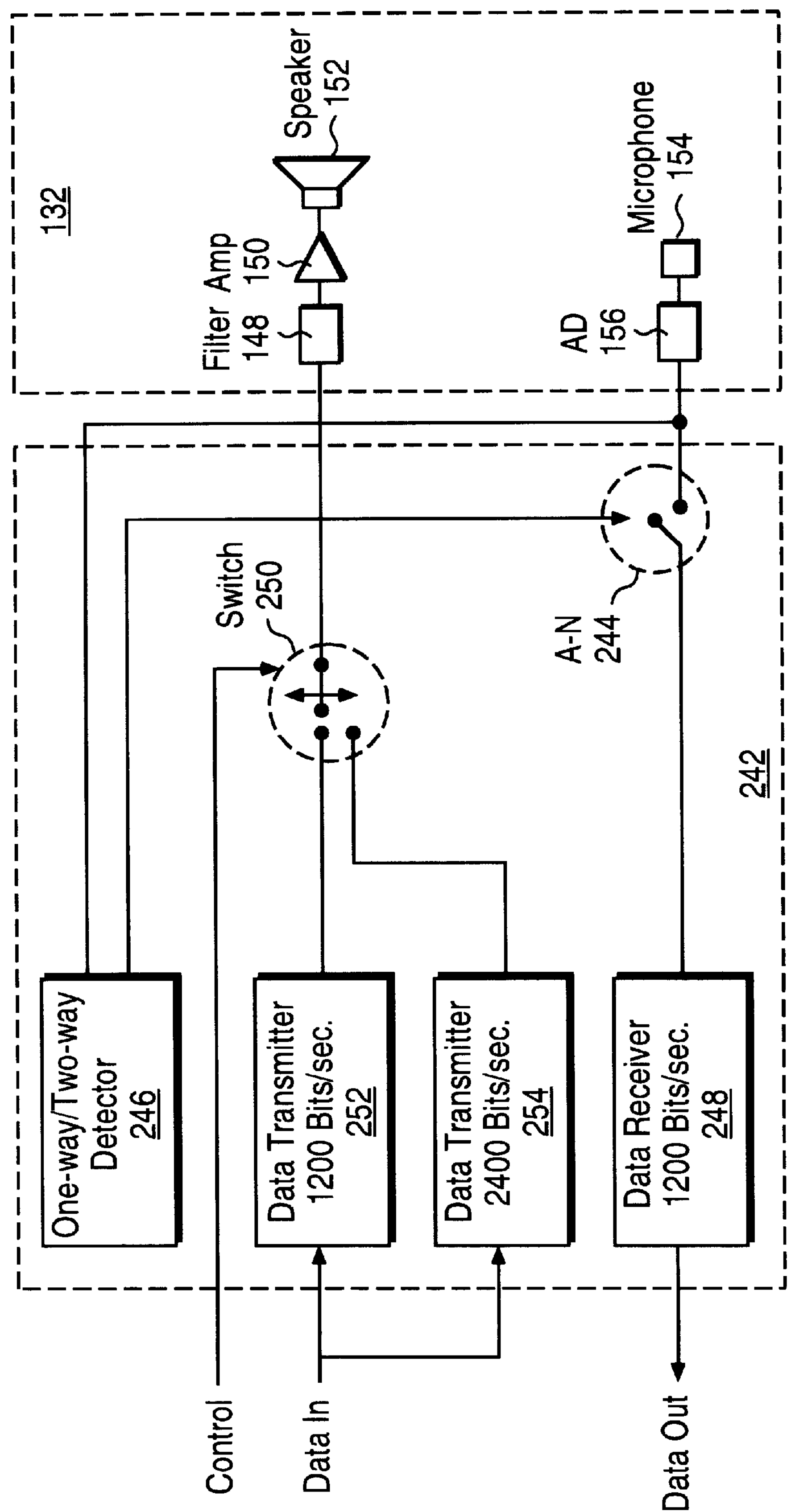
FIG. 10 is a diagram depicting a system for determining the mode of communication within the handheld unit.

FIG. 10 is a block diagram depicting a system 240 for determining the mode of communication (i.e., one-way or two-way) that may occur between the server and the handheld unit over the telephone line. One-way communication occurs when the handheld unit transmits data to the server using the speaker which is acoustically coupled to the telephone handset mouthpiece and the server provides a voice prompt, at the end of the message, to the user indicating the acceptance of the message. The handheld unit cannot receive data over the telephone line during the one-way communications protocol. Two-way communication, on the other hand, is when the handheld unit transmits packets of data using the speaker which is acoustically coupled to the telephone handset mouthpiece and the server may transmit an acknowledgment signal after each data packet back to the handheld unit through the microphone which is acoustically coupled to the telephone handset receiver. The server may also transmit data to the remote unit and the remote unit may acknowledge receipt of each packet of data in the two-way protocol.

A portion of this system may be software applications being executed by the CPU. For example, the transmitters and receivers are software based. The system may include the communications system 132 described above, and a decision system 242. The decision system may include a first switch 244 connected to the microphone 154 and to a one-way/two-way detector 246. To detect whether two-way communication is possible, the one-way/two-way detector 246 may generate a signal that is transmitted through the speaker to the server. The server then transmits a response signal over the telephone line which may be picked up by the microphone if the microphone is acoustically coupled to the telephone handset receiver. Thus, if a signal is detected by the microphone, it may be fed back to the detector 246 which detects the signal and determines that a two-way communication may occur. If no response signal is received, the detector 246 defaults to the one-way mode of communications. Thus, the detector may determine automatically, when a user connects to the server whether a one-way or two-way communication is going to occur. For example, if the user is not holding the microphone close enough to the telephone handset receiver for the acoustic coupling, then the one-way mode of communication will be selected and the user will receive voice prompts from the server.

If a two-way communication is occurring, then the first switch 244 may be closed which electrically connects a data receiver 248 to the microphone to receive acknowledgments from the server or to receive messages from the server in the form of acoustical tones. The received messages or the acknowledgment signals may be output over a DATA_OUT line to the CPU of the handheld unit. The data receiver may be implemented as a software application being executed by the CPU. If the one-way communications occurs, then the receiver is not connected to the microphone. A second switch 250 may electrically connect either a 1200 bits per second software transmitter 252 or a 2400 bits per second software transmitter 254 to the speaker depending on the conditions of the telephone line. The determining system may select the highest transmission speed possible given the telephone line conditions in order to send data from a DATA_IN line. Thus, the system 240 may either select either one-way communications or two-way communications and further 1200 baud transmission or 2400 baud transmission. Now, the details of the one-way and two-way mode of communication will be described.

Figure 11:
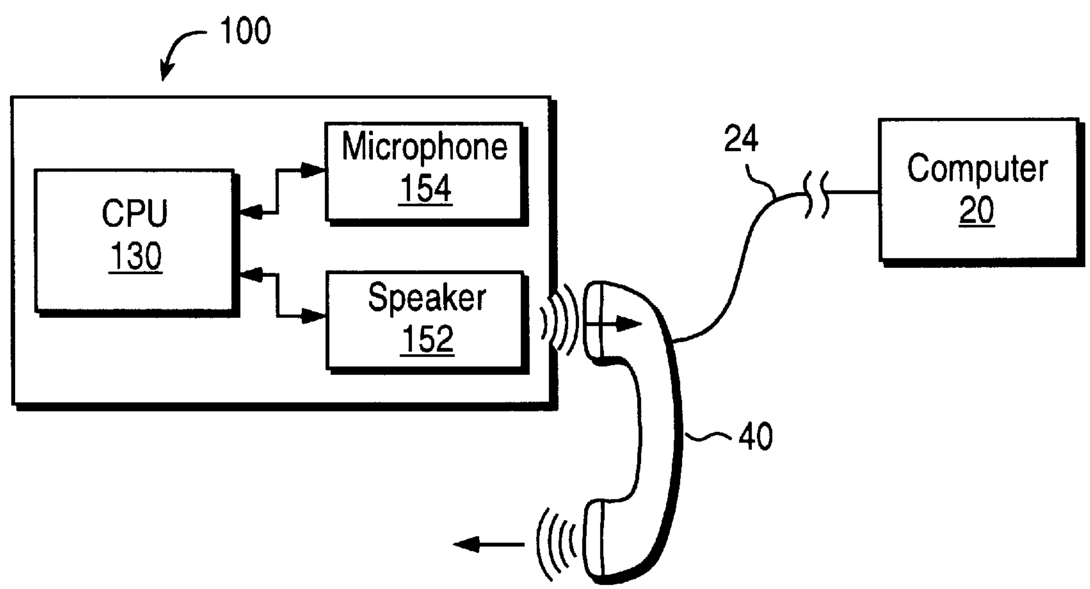
FIG. 11 is a diagram depicting a one-way mode of communication.
Figure 12:
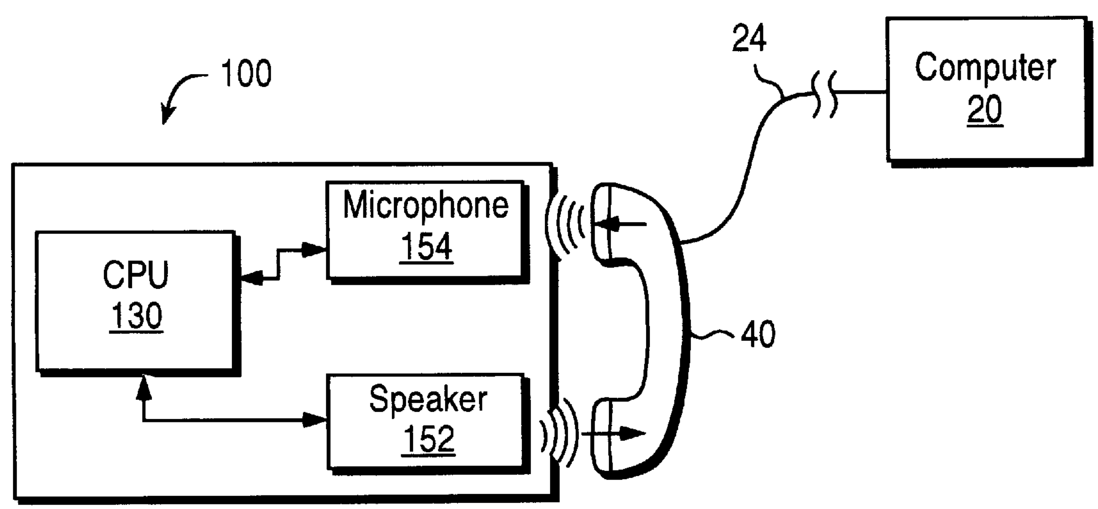
FIG. 12 is a diagram depicting a two-way mode of communication.

FIGS. 11 and 12 are block diagram depicting the one-way and two-way modes of communication in accordance with the invention. As shown in FIG. 11, during the one-way communication, the speaker 152 may generate audio signals that are transmitted over a telephone line 24 to the server 20, and the microphone 154 is inactive. Thus, once the data has been transmitted by the handheld unit 100, the server 20 will generate a voice prompt, which the user may hear through the telephone handset receiver 40, indicating that the messages were received or requesting retransmission. Messages may not be received over the telephone line by the handheld unit in the one-way protocol. As shown in FIG. 12, during the two-way communications, the speaker 152 and the microphone 154 may be acoustically coupled to the telephone handset 40 mouthpiece and the receiver, respectively so that packets of data may be generated by the speaker and transmitted to the server and the server may transmit acknowledgment signals back after each packet which are received by the handheld unit 100 through the microphone 154. In addition, the server may transmit messages to the handheld unit using the microphone and the handheld unit may acknowledge each packet of data using the speaker. Now, a method for interleaving the communicated data to increase the efficiency of the error correction will be described.

Figure 13:
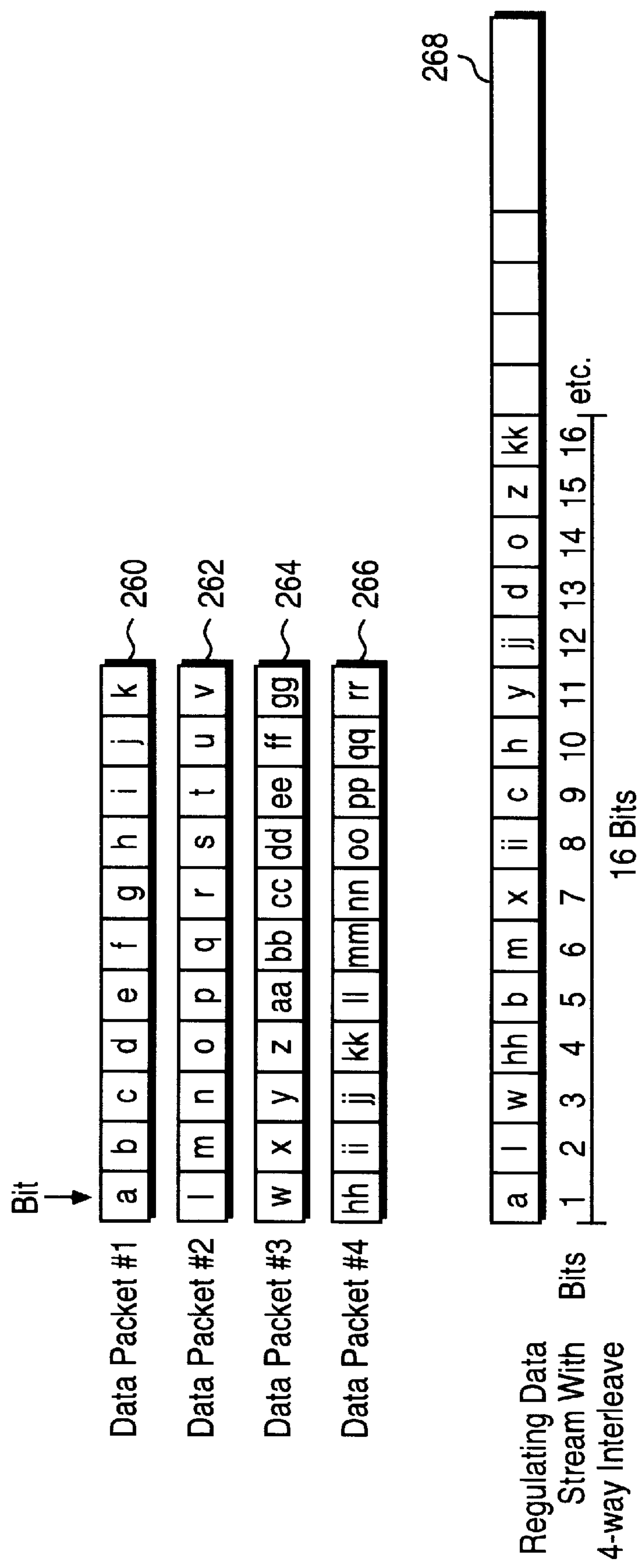
FIG. 13 is a diagram illustrating an interleaving method that may be used in combination with the forward error correction method.

FIG. 13 is a diagram illustrating an interleaving method that may be used together with the error correction method, described below with reference to FIG. 14, to increase the burst correction efficiency of the communications system. In particular, the bits of a plurality of data streams may be interleaved together such that the later error correction of these bits is increased. As an example, a four-way interleaving with four data streams will be described. As shown, a first data stream 260 includes bits a–k, a second data stream 262 includes bits l–v, a third data stream 264 includes bits w-gg, and a fourth data stream 266 includes bits hh–rr. A forward error correcting method, as described below, may correct up to two bits out of every sixteen bits. Thus, only two bits in each of the data streams 260–266 may be corrected. A resulting interleaved data stream 268 is shown in which, for example, bits a–d from the first data stream may be located at bits 1,5,9, and 13 of the interleaved data stream. A first sixteen bits of the interleaved data stream are shown. If the first eight bits of the interleaved data stream are lost or corrupted, each data stream has only two bits corrupted and these two corrupted bits may be corrected, as described below. Thus, the interleaved data stream may increase the burst correction capability of the system. An error correction system, in accordance with the invention, will now be described.

FIG. 14 is a flowchart showing the error detection and correction method used in the electronic messaging system of the present invention. The error correction method of the present invention is carried out within the incoming message system 76 shown in FIG. 2. The encoding of the datastream (the data uploaded from the remote unit to the computer via the incoming message system and its modems) using the error correction method of the present invention takes place within the remote unit. At 300, the error correction method, that may be a Bose, Chaudhuri, Hocquenghem (BCH) forward error correction system, message resending, and error packet overlay error correction begins. At 302, the incoming message system receives the error correction encoded datastream from the remote unit.

The datastream from the remote unit is first encoded by the CPU in the remote unit using a forward error correction method, such as a (15,7,2) BCH information code. The forward error correction method may also use a (26,21,1) BCH code, similar to a Hamming code, which can correct one error. With the (15,7,2) BCH code, the original data from the remote unit is segmented into seven (7) bits, an extra parity bit is calculated (standard even/odd parity) and concatenated at the end of the fifteen encoded bits to generate a sixteen bit word that is easier for standard computer peripherals to use. The data is sent from the remote unit to the incoming message system sixteen (16) bits at a time. Thus, all data from the remote unit to the incoming message system is sent in sixteen (16) bit packets that include fifteen BCH code bits and one (1) parity bit. The fifteen BCH code bits contain seven (7) actual data bits and eight (8) BCH generated code bits. This BCH code can detect and correct up two (2) random errors within each sixteen bit data packet. In addition, the BCH error correction system can also detect more than two errors per packet, but cannot correct for them. In practice, up to four (4) sequential bit errors in a datastream can be corrected if those errors are equally split between two packets (i.e., if two errors occur at the end of packet N and two errors occur at the beginning of packet N+1).

At 304, the incoming message system determines if any BCH errors occurred within each packet. If there were no errors within any of the sixteen bit packets sent from the remote unit, then the error correction method is completed at 306. Similarly, if a packet had two or fewer BCH errors, then the BCH error correction method can correct for those errors at 308 and the method is completed at 310. If any data packet had more than two bit errors, the BCH error correction method detects the errors, and the incoming message system will request, through an audible tone or a voice message, that the remote unit user resend the data at 312.

After the data is resent at 312, the incoming message system determines if any errors are present within any data packet in step 314. If 0, 1, or 2 errors exist within a data packet of the resent datastream, then the error correction ends at 316. An error packet overlay correction, at 318, may be used, if errors still exist in any of the data packets. The error packet overlay error correction method will be described more fully below with reference to FIG. 15. At 320, it is determined whether any errors still remain after the error packet overlay correction. If all errors have been corrected by the error packet overlay correction, then the method ends at 322. If uncorrectable errors still exist within any data packet after the error packet overlay correction, then in step 324, it is determined whether the data has been sent more than three times. If the data has been sent less than three times, then the process returns to 312 where the data is sent again and error packet overlay correction is conducted. If the data has been sent three or more times, then at 326, a majority bit vote by packet correction method, described in more detail below with reference to FIG. 13, may be invoked. At 328, it is determined whether or not any errors remain after the majority bit vote by packet has been completed. If no errors are present, then the method ends at 330. If errors are still present after the majority bit vote by packet, then the process returns to 312 in which data is resent. In operation, the error correction method of the present invention provides three separate levels of error correction that ensure that an error-free datastream is received by the incoming message system.

Figure 15:
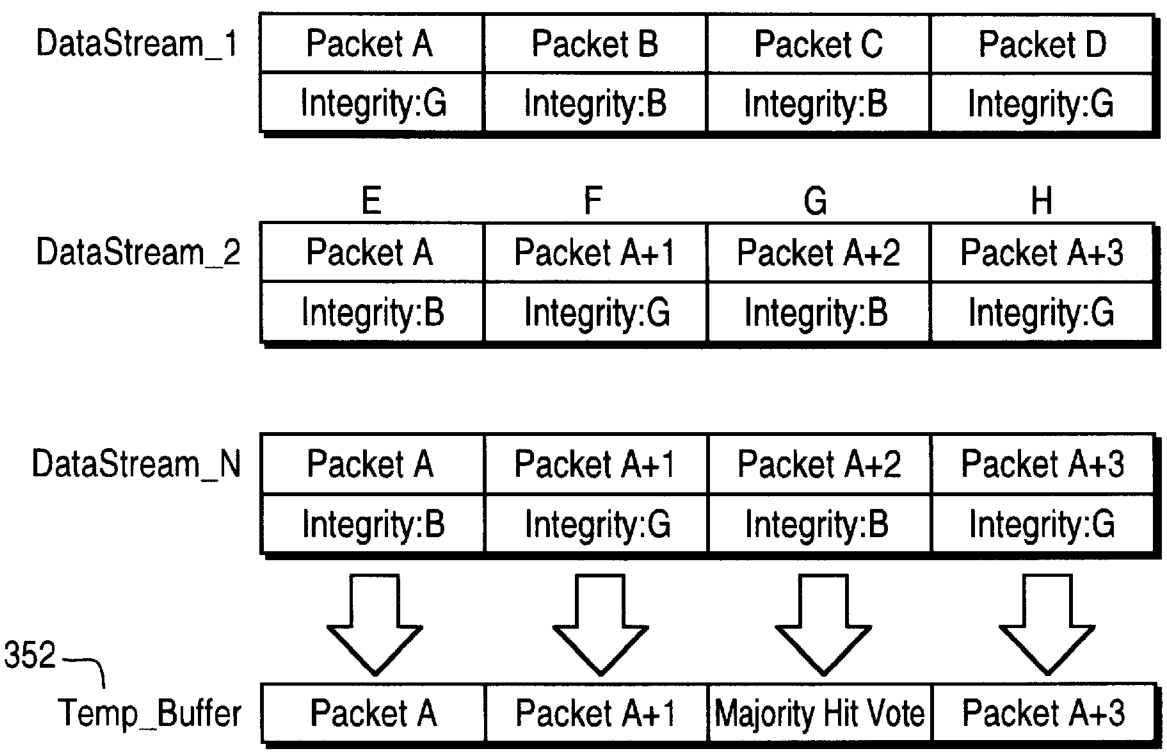
FIG. 15 is a diagram of a data packet integrity check in accordance with the invention.

FIG. 15 is a schematic diagram showing the error packet overlay error correction method. As a datastream is received by the incoming message system, each 16 bit BCH packet has an integrity flag attached to it by the incoming message system that identifies the packet as a good packet (errors less than or equal to two) or as a bad packet (errors greater than two).

In this discussion, the (26,21,1) BCH code is described, but the same concept may also be applied to the (15,7,2) BCH code with some minor modifications. In particular, for the (26,21,1) BCH error correction can correct one "error" bit (i.e., the bit is wrong and its value should be flipped, such as from "0" to "1" or vice versa) or two "erasure" bits (i.e., bits which are probably wrong since the bit value for a first and second datastream are different). To label packets with good or bad integrity flags, each bit within the packet is reviewed. When only a single datastream has been transmitted, each packet with only a single error bit nay have a good integrity flag since only a single error bit in each packet may be corrected. Once the datastream has been resent due to bad integrity flags, in addition to labeling bits as "error" bits, bits may also be labeled as "erasure" bits. A bit is labeled as an "erasure" bit if the bit has one value in the first datastream, but then the other value in the second datastream. A data packet with two "erasure" bits may be labeled with a good integrity flag. Then, the "erasure" bits in the packet may be corrected as described below.

If there is at least one bad packet in the datastream, then the entire datastream is resent. As provided above, the datastream may be resent up to N times yielding N datastreams (datastream_1, datastream_2, and so forth, up to datastream_N) that are stored temporarily. As shown, the integrity flags for each packet are also stored along with each individual data packet. A temp_buffer memory 352 is used to store the results of the error packet overlay error correction method set forth in FIG. 13. In the example, shown in FIG. 15, each of the datastreams may have an A data packet, a B data packet, a C data packet and a D data packet. As shown, for packet A, the packet from datastream_1 is stored in the temporary buffer because it has a good integrity flag. Similarly, for packet B, the packet from datastream_2 or datastream_N may be stored in the temporary buffer because both have good integrity flags. For packet C, since all of the datastreams have bad integrity flags, the majority bit vote by packet error correction method is conducted. Finally, for packet D, any one of the packets from the three datastreams may be used because all of the integrity flags are good.

Figure 16:
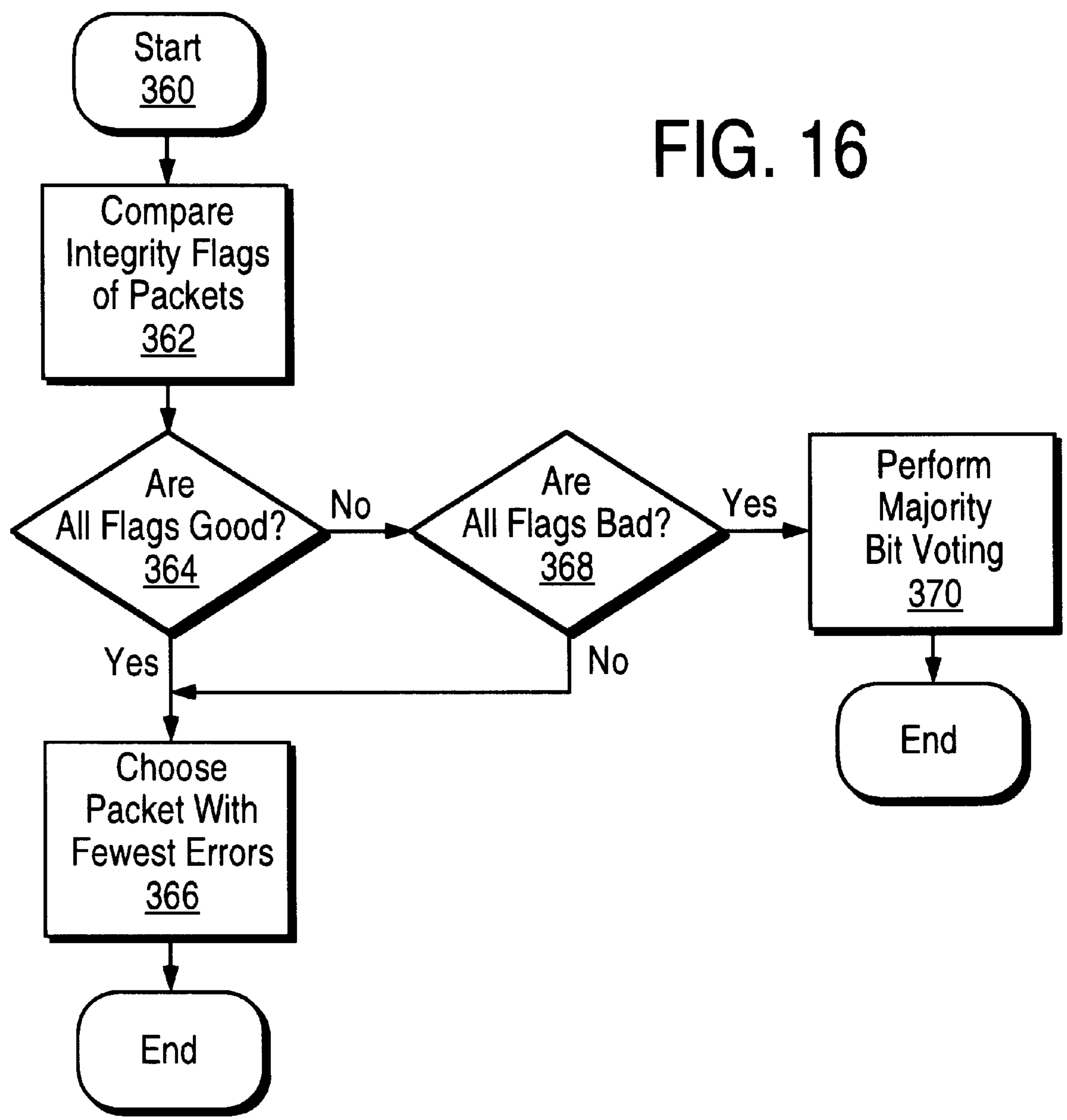
FIG. 16 is a flowchart depicting an error detection and correction method in accordance with the invention.

FIG. 16 is a flowchart showing the operation of the error packet overlay error correction method and when the majority bit voting error correction method is conducted. The method begins at 360. At 362, the integrity flags (flag1, flag2, . . . flagM) of a particular data packet (1,2, . . . M) for each datastream are compared to each other. For example, as shown in FIG. 12, for data packet A, the integrity flag (flag1) of datastream_1 is good, the integrity flag (flag2) of datastream_2 is bad and the integrity flag (flagM) of datastream_N is bad. At 364, it is determined whether or not all of the integrity flags are good. At 366, if all of the integrity flags for a particular data packet are good, then the data packet with the fewest errors is stored within the temp_buffer memory 352. At 368, it is determined if all of the integrity flags are bad. If all of the integrity flags are bad, then at 370, a majority bit vote by packet is done as long as at least three datastreams are present. If the integrity flags are not all bad, then the packet with the fewest errors is selected at 366. Once the data packet with a good integrity flag and the fewest errors is selected at 366, any errors in the data packet are corrected. For up to two "erasure" bits in the selected data packet, the "erasure" bit may be corrected in a conventional binary erasure technique. An example of a binary erasure technique is described in the following textbook which is incorporated herein by reference: *Error Control System for Digital Communications and Storage*, Stephen B. Wicker, Prentice Hall, 1995, pp. 229. Now, the majority bit vote by packet method will be described.

Figure 17:
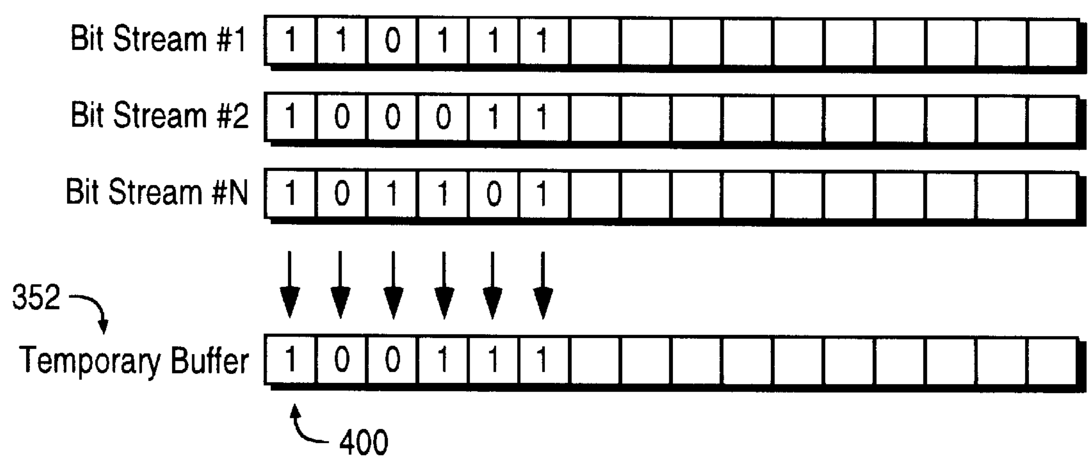
FIG. 17 is a diagram illustrating a majority bit voting method in accordance with the invention.

FIG. 17 is a schematic diagram of the majority bit vote by packet method that is part of the error detection and correction method shown in FIG. 14. Each bit within the data packet is chosen to match the majority (more than fifty percent) of the bits being compared (i.e., the chosen value is the same as the value of 2 out of 3 bits that are compared). For example, as shown in FIG. 14, bit_one 400 in each datastream is 1,1, . . . 0 respectively for each datastream such that the majority (more than fifty percent) of the bits are equal to "1". Accordingly, bit-one is set to "1". Once the new packet values are determined by the majority bit method, the newly assembled data packets are checked for errors using a conventional checksum method and the BCH method and are then stored in the temp_buffer memory. In this manner, all of the data packets within the datastream are determined so that the datastream can then be processed by the incoming message system.

Thus, using this multi-level error detection and correction system in accordance with the invention, the data transmitted from the remote unit to the computer will be substantially error free. For most transmissions, the data may need only to be resent once and the error packet overlay method will detect and correct any errors in the data. This multi-level error detection and correction system increases message transmission reliability. In addition, this error correction and detection system is fast so that the user will very quickly receive an acknowledgment signal. This quick error detection and correction allows the user and remote unit to stay connected to the computer as short amount of time as possible without sacrificing message transmission integrity.

FIG. 18 is a flowchart showing the operation taken by the incoming message system 76, shown in FIG. 2, for processing an incoming remote unit message. At 440, the telephone call from the user with the remote unit is answered by the incoming message system and, at 442, the incoming message system plays an audible message, such as a synthesized or pre-recorded voice message, instructing the user to "Send the data now" by holding the remote unit next to the telephone handset microphone and pressing the Send button. The voice message played by the incoming message system may be stored in the database, shown in FIG. 2. Then at step 444, the incoming message system receives data from the remote unit, including any outgoing message data, any new e-mail screening criteria, and a log of pager messages received by the remote unit since last communication with the incoming message system.

The e-mail screening criteria allow the computer to automatically screen e-mail messages ultimately destined for the remote unit user. For example, messages that are sent from a person considered particularly annoying by the user of the remote unit may be screened out. The pager message log is used to ensure that the remote unit user receives all of his/her incoming pager messages and to cause the computer to re-transmit any lost pager messages. After the error correction and detection is performed at 445, at 446, it is determined whether or not all of the data received from the remote unit is sufficiently error-free. The error detection and correction that occurs in the incoming message system when a message is received is described above with reference to FIGS. 14–17. If the data contains too many errors, then control goes back to 442, where the incoming message system plays an audible message requesting that the data be resent. However, if the data is sufficiently error-free, then at 448, the incoming message system plays another audible message that tells the user that the data was received clearly. The messages played by the incoming message system may be stored in the database, shown in FIG. 2. After the data received message is played, the incoming message system hangs up the phone at 450.

After hanging-up the phone with the user, the further processing of the incoming data stream begins (452). The incoming data is separated into the e-mail screening criteria, as described above, the incoming messages (each being separated according to its ultimate destination), and the log of previously received pager messages, as described above. Then, the log of previously sent pager messages is analyzed (454) and compared to the log of previously received pager messages, and it is determined if all paging messages sent to the user's remote unit were properly received since the user last uploaded data to the incoming message system (456). If the user's remote unit has not properly received all of the previously sent pager messages, then the incoming message system locates the user's missing/lost pager messages in the database (458), shown in FIG. 2, and uploads them to the paging system, shown in FIG. 2, for re-transmission to the remote unit.

Once any missed pager messages have been re-transmitted, or once all previously sent pager messages have been confirmed as received, then the incoming message system at 460, forwards any changes in the e-mail screening criteria to a user records database stored in the database, shown in FIG. 2. Then, at 462, any outgoing messages are forwarded to an outgoing message stack and control in the computer is now transferred, at 464, to the individual systems that handle the various types of outgoing messages. For example, if the outgoing messages contained an e-mail message and a facsimile message, then control would go to the facsimile system and to the e-mail system. The various message systems in the computer may also operate simultaneously and independently and process several different messages simultaneously.

Figure 19:
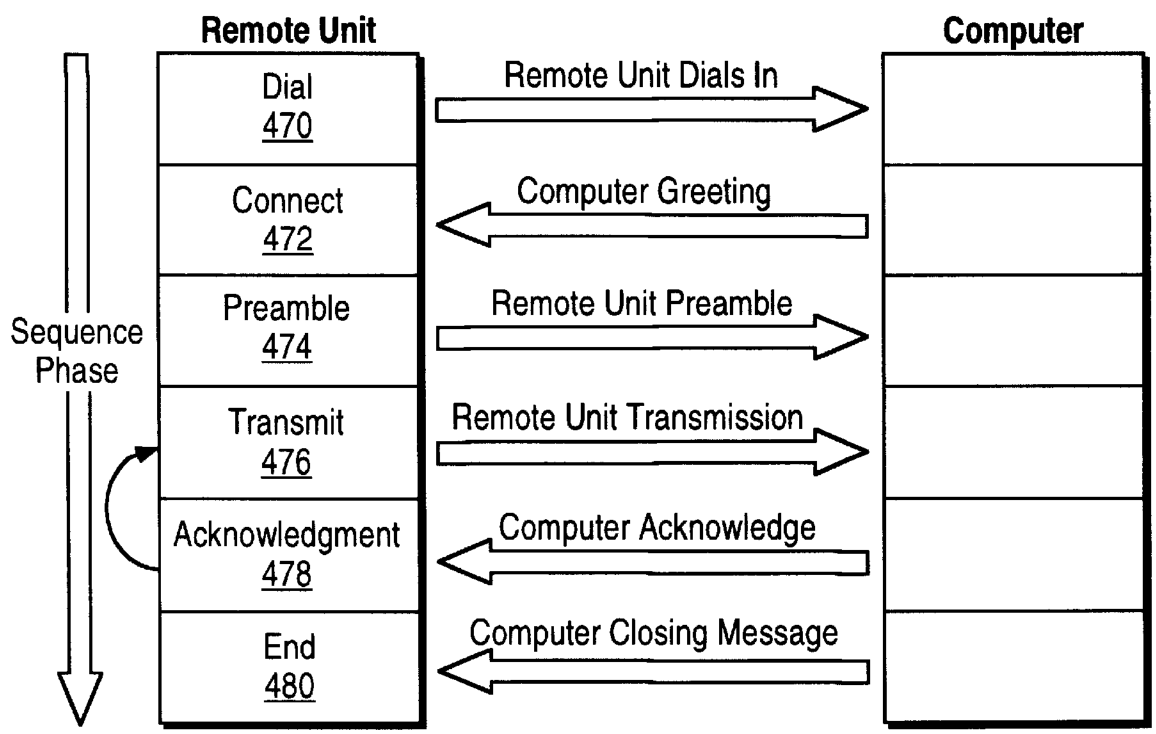
FIG. 19 is a flowchart of a one-way transmission protocol in accordance with the invention.

FIG. 19 is a schematic diagram showing the transfer communications protocol between the remote unit and the computer during data transfer. The transfer protocol provides a way of identifying the remote unit to the computer, a method of verifying that the data has been received correctly, and a way of requesting that the data be resent if it is not received. As shown, there may be six phases of a data transfer between the remote unit and the computer, including a dial phase 470, a connect phase 472, a preamble transmission phase 474, a data transmission phase 476, an acknowledgment phase 478, and an end phase 480.

In the dial phase 470 and connect phase 472, a connection through a first communication link, such as a telephone line, is established between the user of the remote unit and the computer. The computer may generate an audio tone, or synthesized voice welcome message instructing the user to begin sending data. Once connected, the user holds the speaker of the remote unit close to the telephone handset microphone and presses the SEND button of the remote unit to initiate the preamble phase of the communications protocol between the remote unit and the computer.

In the preamble phase 474, the remote unit sends preamble data to the computer. The preamble data may include a synchronization part, a remote unit identification number, features data, a time and date stamp, error correction type data, modulation selection data, packet size selection data, a checksum, and extension data for any additional information. The features data notify the computer of the particular features of the particular remote unit in use at that time, such as the type of acknowledgment signal, whether a cellular phone connection is being used, whether the data is encrypted, and whether the acknowledgment from the computer to the remote unit user should occur at the end of each data packet transmission or at the end of all data packet transmissions (i.e., after the entire datastream containing the plurality of data packets has been transmitted). The preferred acknowledgment signal may be generated after the entire datastream has been transferred, as described above. The error correction data specifies the type of forward error correction being used for the data transmission. The packet size data permits the size of the data packets (i.e., the number of bytes between acknowledgment signals) to be varied between 1 byte and 256 bytes. The checksum data is transmitted in the preamble to enable the computer verify the integrity of the data in the preamble.

The remote unit may also permit the user to select one of several transfer modes before the data is transferred from the remote unit to the computer. The changes in the user selectable transfer mode may effect changes in the values of the data sent within the preamble, including the type of forward error correction being used, the type of modulation being used, and the number of times that data will be resent. The user selectable transfer mode may allow the user to choose between a cellular mode, a payphone mode (a payphone typically has more noise problems than a normal telephone line), and a normal telephone line mode. Each of these user selectable modes configures the transfer protocol differently to optimize the remote unit's transmission for each particular environment. For example, for a cellular connection, which is generally extremely noisy and hard to communicate over, the amount of forward error correction may be increased, the modulation may be changed, and the number of times data may be resent is increased. Thus, a user is able to select a transfer protocol that is optimized for a particular type of first communications link, and the remote unit may provide data formatted in that optimized transfer protocol to the computer.

Once the preamble is received and the computer has configured itself to receive data formatted in accordance with the user selectable transfer protocol, the remote unit transfers the data containing the various electronic messages and forward error corrected electronic messages in the transmit phase 476. Once the transmission of the data is complete, the computer checks all of the data packets within the data for errors, as described below.

In the acknowledgment phase 478, the computer transmits an acknowledgment signal that may either inform the user that the data was received without uncorrectable errors or inform the user that the data must be resent due to errors within the data packets. Once the data has been correctly received, the computer generates a closing message to the user, during the end phase 480, and closes the phone connection with the user and the remote unit.

The transfer protocol provides a system wherein the user of the remote unit may select a different transfer protocol, depending on the communications link to be used, in order to optimize the transfer, as described above. The transfer protocol may also permit the user to receive an audible acknowledgment signal from the computer. This acknowledgment signal enables the user to know that the data has been received without errors or must be resent immediately after the data transmission so the user can resend the data without having to reestablish another connection through the first communications link. A preferred error detection and correction scheme will be described below, but many different error detection and correction schemes, such as a checksum scheme, may be used in the encoding of data to be sent by the remote unit system.

Figure 20:
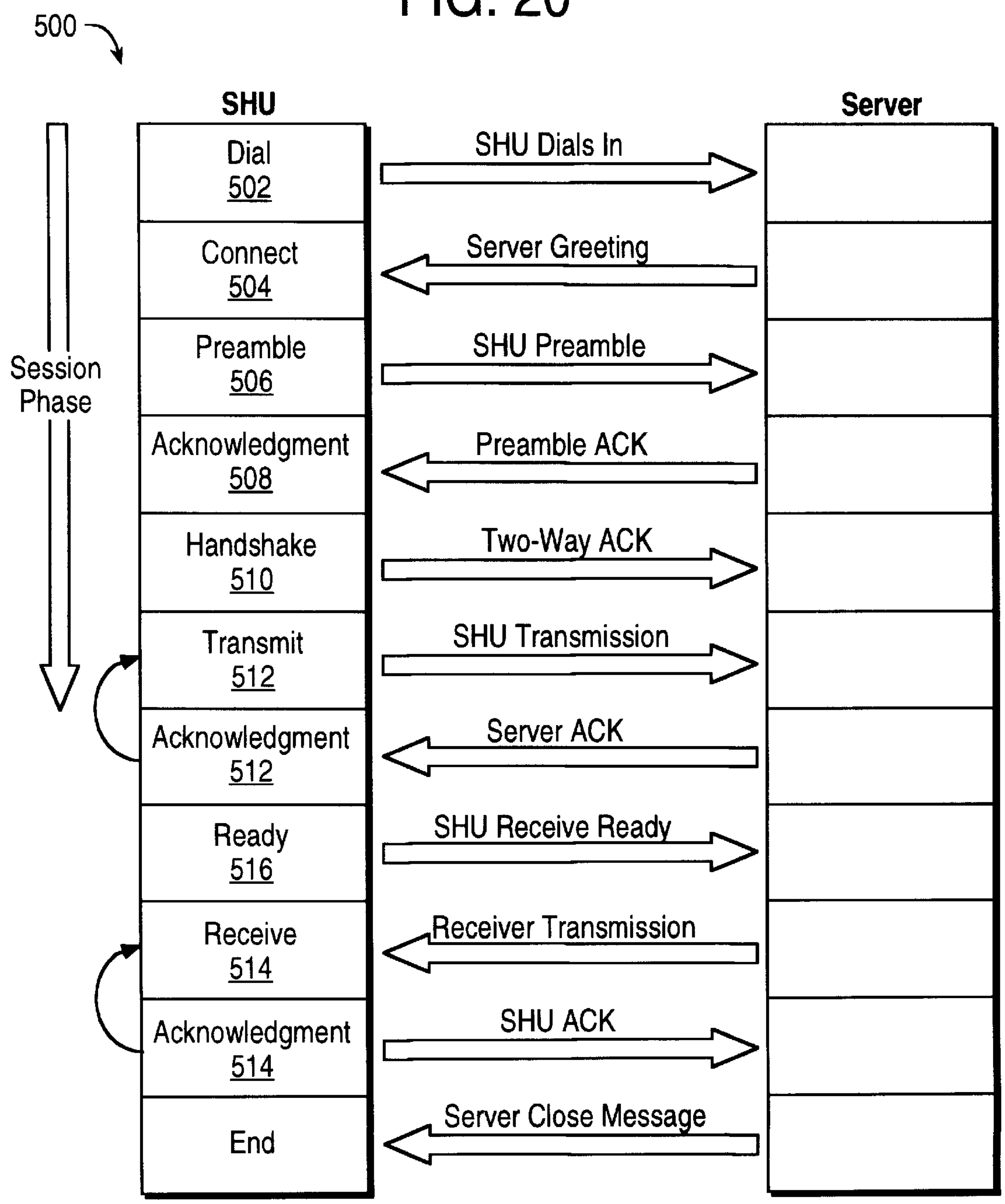
FIG. 20 is a flowchart of a two-way protocol in accordance with the invention.

FIG. 20 is a diagram of a two-way communications protocol 500 in accordance with the invention. As shown, the start of a communication session begins at the top of the figure in a step 502 in which a user of a handheld unit dials the server's telephone number. An audible greeting message is then sent back to the user in a connect step 504. The user begins a session by pressing the Send or Send/Receive key on the handheld unit. All data exchange is half-duplex. A preamble 506, containing user date, may then be sent from the handheld unit to the server. The server may then send an acknowledgment 508 in the form of a audio tone which is received by the microphone and processed by the CPU in the handheld unit. Next, during a handshake step 510, information about the current handheld unit configuration is transmitted to the server and the server may perform some line conditioning. The server may send an acknowledgment. Next, during a data transmission step 512, the handheld unit transmits packets of data to the server and the server may acknowledge each data packet or request the data packet to be retransmitted. Once all of the messages have been transmitted, a receive phase 514 begins and the handheld unit transmits a receiver ready signal tone 516 and the server may begin transmitting any incoming messages to the handheld unit. The handheld unit may acknowledge receipt of each data packet or request resending. Once all the messages have been received, the server may generate a voice prompt indicating the transmission session is complete and hangs up the telephone line. Now, the operation of the message summary and the LED's will be described.

Figure 21:
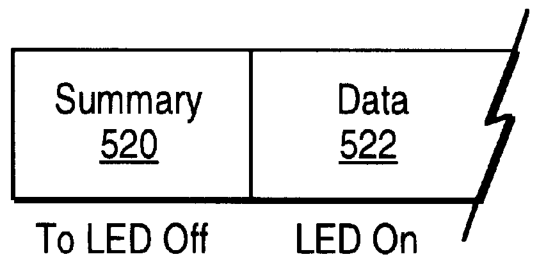
FIG. 21 is a diagram depicting a message summary in accordance with the invention.

FIG. 21 is a diagram illustrating a message summary in accordance with the invention. At the beginning of an incoming message transfer, the LED's on the case as shown in FIG. 4, are off indicating that no transfer has occurred yet. The first packet of information to be transmitted from the server to the handheld unit may be a summary block 520, which may include a summary of each of the incoming messages for a user. The summary provides sufficient information so that a user may review the summary and determine which messages he wants to download. Once the summary block has been successfully received, one of the LED's may illuminate which indicates that the transmission of the messages 522 is now commencing and the total estimated time of the download of the messages. In addition to providing the user with a summary of the messages, the completion of the summary also ensures that, if the user breaks the telephone connection at any time during the message transmission, the lost messages may be easily retransmitted because the summary contains a log of the incoming messages that should have been received. Thus, if a user is in a hurry, he may download the summary, see an LED illuminate and then terminate the connection without any loss of summary data. The summary may also be periodically transmitted over the pager frequency so that a user may review the summary and then only download the messages selected by the user which may significantly reduce the transmission time of the messages. For example, the user may have subscribed to a listserv mailing list and may determine that he does not need to view those listserv messages immediately. Now, a system, that may be located on the server, for conditioning the signal based on the condition of the telephone line will be described.

Figure 22:
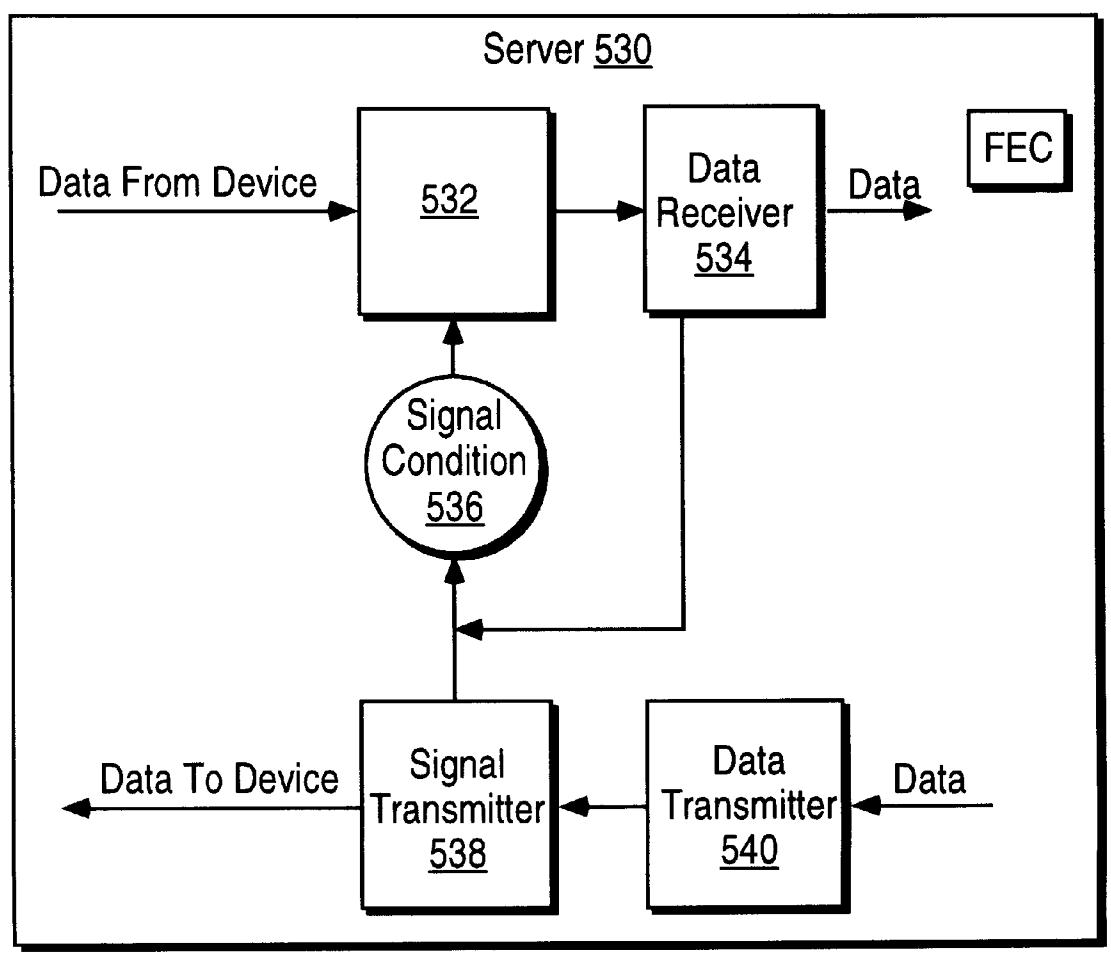
FIG. 22 is a diagram of the signal conditioning system within the server system.

FIG. 22 is a diagram illustrating a telephone line signal conditioning system 530, in accordance with the invention, that may be located on the server. The telephone line signal conditioning system may be asymmetric in that the adjustment of the signals due to the line conditions is performed entirely by the server. In a conventional modem type connection, the modems on each end of the telephone line may communicate with each other and jointly adjust the signal based on line conditions. The telephone line signal conditioning system may include an incoming signal receiver 532, a data receiver 534 attached to the signal receiver, a signal conditioner 536 attached to the signal receiver and a signal transmitter 538, and a data transmitter 540 connected to the signal transmitter. Briefly, in operation, signals may be received from the handheld unit over the phone line by the incoming signal receiver and signals may be transmitted, over the telephone line, to the handheld unit using the signal transmitter. As a signal is received from the handheld unit, the signals enters the signal receiver. The signal conditioner may detect a plurality of characteristics of the signal which may indicate the current telephone line conditions. For example, the signal conditioner may detect a phase shift, a frequency shift, and/or clock jitter by comparing the signal to what the signal would assuming a perfect transmission link. The signal conditioner may provide some adjustment to the signal to account for the errors, such as changes in the phase or frequency. The signal conditioner may also adjust the signal to account for clock jitter, which causes the location of the start of a data packet to vary slightly. Thus, the handheld unit may have a cheaper, less accurate clock and the jitter caused by the cheaper clock does not adversely affect the transmission or reception of messages.

Once the appropriate adjustments have been determined, the signal conditioner may adjust the signal received by the signal receiver and corrected signal may be passed on to the data receiver that performs the decoding of the forward error corrected data. The adjustments based on the incoming signal may also be used to adjust the signal transmitter 538 so that the data being transmitted to the handheld unit may be pre-adjusted for the line conditions. Thus, the signals received by the handheld unit from the server should appear unaffected by the line conditions since the signal have already been pre-adjusted for the line conditions. In this manner, the server may perform the line conditioning based on the received signal and the handheld unit does not perform any of the line conditioning. This reduces the complexity of the software modem located in the handheld unit and does not adversely affect the quality of the communications between the server and the handheld unit. Now, a secure communication channel within the server will be described.

Figure 23:
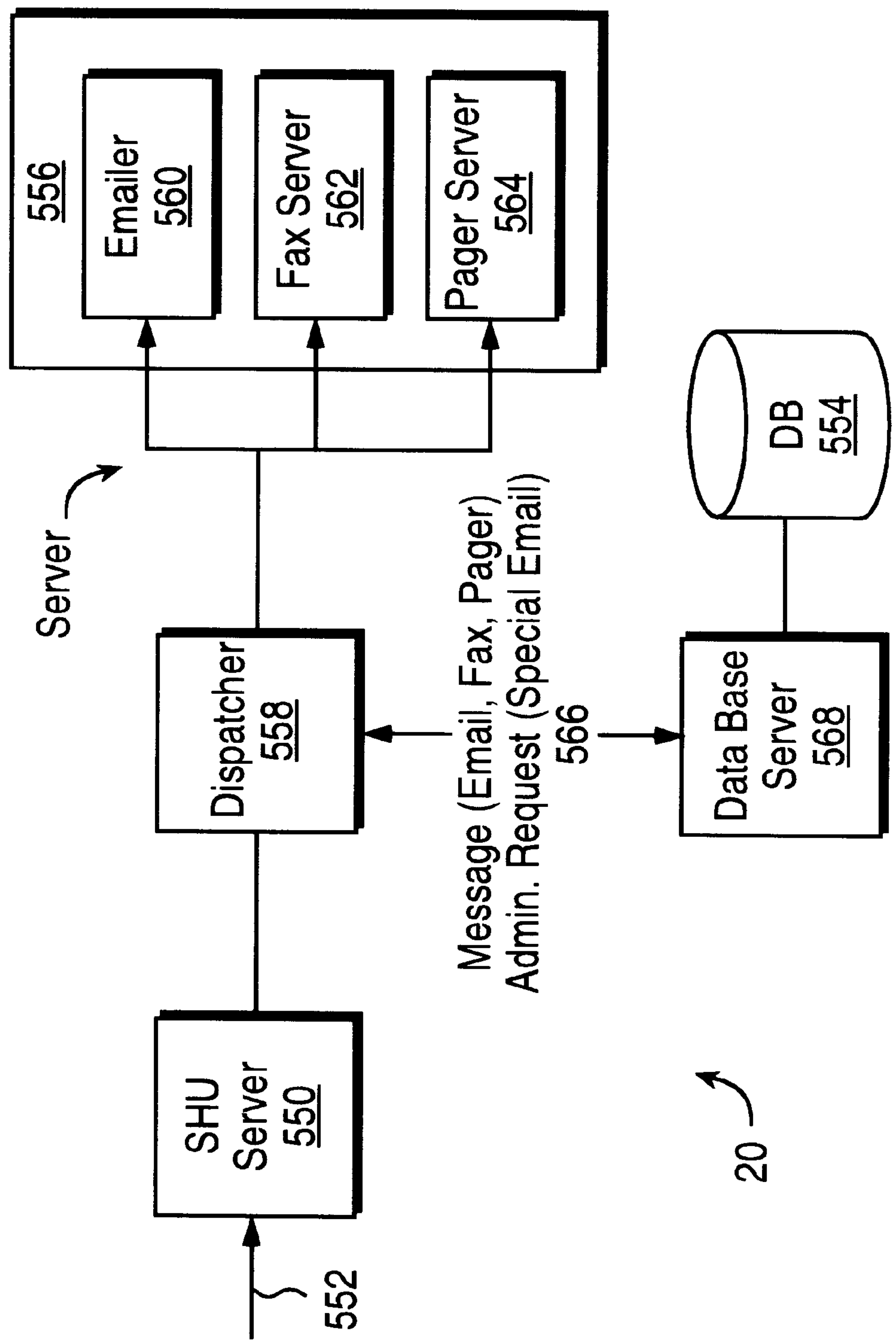
FIG. 23 is a diagram of a secure data channel within the server in accordance with the invention.

FIG. 23 is a diagram of a secure data channel within the server in accordance with the invention. As shown, the server 20 may comprise an incoming server 550, which may have a T1 communications link 552 connected to it so that user may connect with the incoming server using the T1 link. The data received by the incoming server may include data destined for a user database 554, such as billing information or user preferences for the system, and message data to be transmitted by an output system 556. All of the data received may be forward error corrected and may be transferred to a dispatcher 558 that may separate the user database data from the message data. The message data may be forwarded to the output system 556 where messages may be transmitted, for example, by an e-mail system 560, a facsimile system 562, or a pager system 564 depending on the type of message. The user database may be encrypted by the dispatcher 558 using any known encryption system, such as a public key encryption system, and transmitted over a communications link 566 to a user database computer 568 that may be attached to the user database. The user database server may decrypt the user database and perform the appropriate functions using the data. The only access to the user database computer and the user database is over the communications link. The only data that may enter the user database computer is the encrypted data. Thus, the encryption of the data prevents an intruder from accessing the user database or the user database computer and increases the security of the system.

Figure 24:
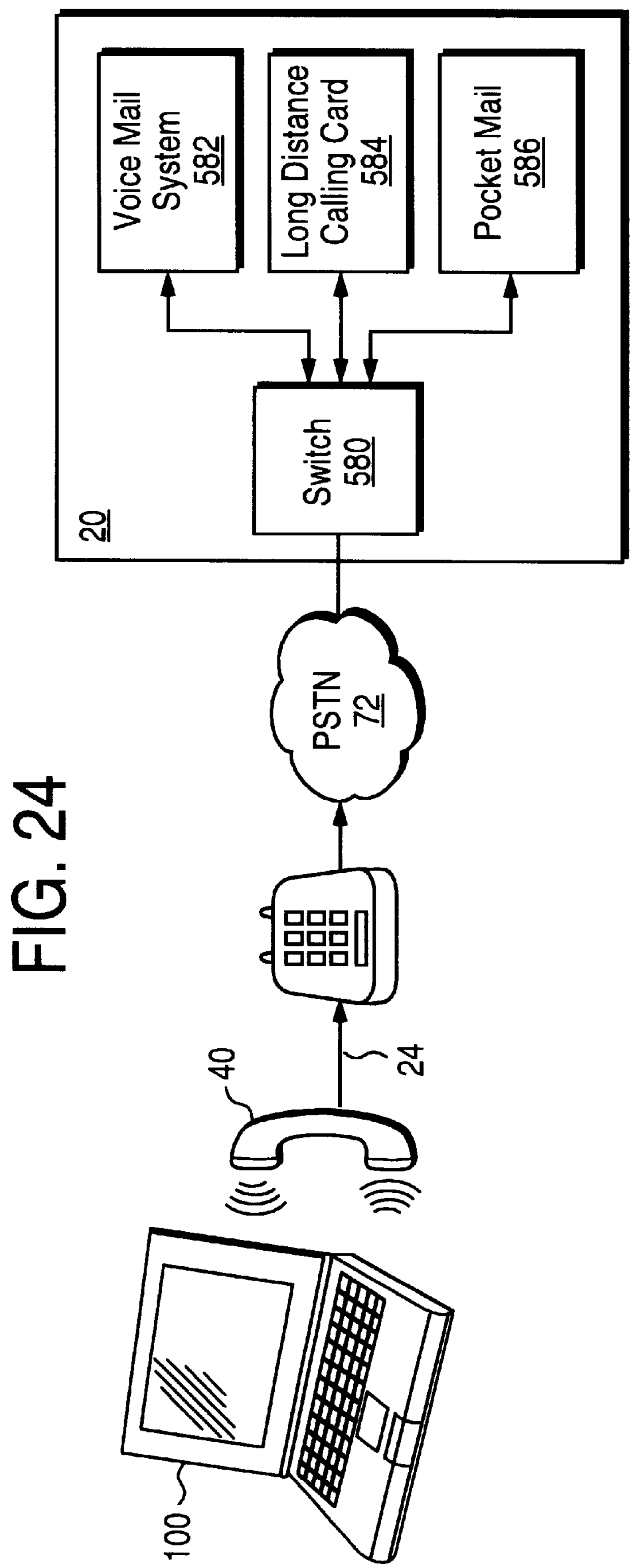
FIG. 24 is a diagram of a user performing voicemail operations and data communications with the handheld unit during a single phone call in accordance with the invention.

FIG. 24 is a diagram depicting an integrated communications session in accordance with the invention. The user of a handheld unit 100 may establish a communication link with the server 20 and, as shown, the handheld unit 100 may be acoustically coupled to a telephone handset 40 in either a one-way or a two-way communications protocol as described above. The telephone handset may be attached to a PSTN 72 which may be connected to a switch 580 located, for example, within the server. With the acoustically coupled handheld unit and his voice, a user may either communicate data acoustically over the telephone line to the server or communicate voice messages. For example, the switch 580 may be electrically connected to a voicemail system 582, a long distance calling card system 584, and an electronic messaging system 586 that may be communicate with the handheld unit. The switch permits a user to move between these systems quickly and without terminating the telephone call. Thus, with a signal telephone call, a user may check his voicemail and respond to any voicemails, may place long distance telephone calls and/or may use the handheld unit to transmit data to/from the server. This permits a user to quickly and easily access several different communications systems. In addition, during a single communications session, a user may conduct voice communications as well as data communications at any time during the session due to the acoustic communication protocol of the handheld unit.

The switch may be an electronic switch which is responsive to audio tones and may switch between various systems, such as the voicemail system, the messaging system or a calling card system. Each of the system may be switched to in response to a different audio tone. The various audio tones may be generated by a user pressing various numerical keys on a telephone handset keypad as is well known. Thus, the switch may detect the various audio tones generated due to a user pressing a key on the telephone handset keypad and switch the user to the selected system without disconnecting the telephone line.

While the foregoing has been with reference to a particular embodiment of the invention, it will be appreciated by those skilled in the art that changes in this embodiment may be made without departing from the principles and spirit of the invention, the scope of which is defined by the appended claims.

We claim:

1. A system for communicating data between a computer and a unit remote to the computer, comprising:

means in the remote unit for receiving input information from a user and for producing data signals corresponding to the input information;

means in the remote unit for generating acoustical tones corresponding to the input information;

means for communicating said acoustical tones over an acoustical communications link to the computer;

said communicating means further comprising means for determining, based on predetermined criteria, whether a bi-directional communications channel has been established over the acoustical communications link between said computer and said remote unit;

receiving means in the remote unit for receiving data from the computer over a second communications link which is independent of the acoustic communications link so that the remote unit receives data from the computer over two different communications links;

means in the remote unit for determining the length of time for the transmission of the acoustical data sent from the computer to the remote unit prior to the transmission of the acoustical data; and means for indicating the length of time of the acoustical data transmission.

2. The system of claim 1, wherein said acoustical communications means comprises means, if the bi-directional communications channel has not been established between said computer and said remote unit, for coupling the acoustical tones to the acoustical communications link for unidirectional transmission from the remote unit to the computer, and means, in the remote unit, for receiving a voice prompt from the computer after the data has been transmitted to acknowledge receipt of the acoustical tones.

3. The system of claim 2, wherein the computer further comprises means for receiving data packets from the remote unit, the data packets each comprising a plurality of bits, means for error checking the data packets in the computer, means for resending all data packets when errors are present in any data packet, means for comparing the first-sent data packets to corresponding ones of the resent data packets to determine the presence of errors, and means for comparing corresponding bits of each first-sent data packet and each resent data packet to select a bit value that is present in more than half of the data packets.

4. The system of claim 3, wherein said resending means comprises means for generating a voice prompt instructing the user to resend the data packets if a bi-directional communications path has not been established between the remote unit and the computer, and wherein said resending means comprises means for transmitting an acoustical tone to the remote unit to request the resending of the data packets when a bi-directional communications path has been established.

5. The system of claim 1, wherein said communicating means further comprises means, if a bi-directional communications path is established between the remote unit and the computer, for transmitting said acoustical tones over the acoustical communications link to the computer and means for receiving acoustical tones from said computer over said acoustical communications link to acknowledge receipt of the acoustical tones.

6. The system of claim 1, wherein the acoustical communications link comprises a telephone link and wherein the second communications link comprises a wireless link, and the means for receiving data from the second communications link comprises a radio pager receiver.

7. The system of claim 1, wherein said computer comprises means, if the bi-directional communications path has been established between the remote unit and the computer, for adjusting the acoustic tones transmitted to the remote unit over said acoustical communications link from the computer, the acoustical tones being adjusted for the conditions of the acoustical communication link prior to transmission to the remote unit.

8. The system of claim 7, wherein said adjusting means further comprises means for receiving said acoustical tones from said remote unit, means for determining line condition errors from said received acoustical tones, means for correction said received acoustical tones for said line condition errors, and means, if a bi-directional communications path has been established, for transmitting acoustical tones to the remote unit, the transmitted acoustical tones being corrected based on said line condition errors in the received acoustical tones.

9. The system of claim 8, wherein said means for determining line condition errors comprises means for detecting phase errors in said received acoustical tones, means for detecting frequency errors in said received acoustical tones and means for detecting clock errors within said acoustical tones received from the remote unit.

10. The system of claim 1, wherein said time length determining means comprises a preamble message that is transmitted from the computer to the remote unit prior to the transmission of a plurality of messages, the preamble message containing a summary of each message that is going to be transmitted to the remote unit and a time length for each message transmission.

11. The system of claim 10, wherein said transmission length indication means comprises means for indicating to the user of the remote unit that breaking of the acoustical communications link would not result in the loss message data.

12. The system of claim 1, wherein said remote unit further comprises means for generating a command message that contains commands for the computer and preferences of the user, said command message being a first message transmitted to the computer when a communications link is established between the remote unit and the computer.

13. The system of claim 1, wherein said computer further comprises means for establishing a communications session between said remote unit and the computer over the acoustical communications link and means for switching between a plurality of different messaging sessions based on acoustical tones received during the communications session, said plurality of messaging sessions comprising an acoustical voice data session for receiving voicemail messages and an acoustical electronic data communications session for communicating acoustical electronic data between the remote unit and the computer so that the user may communicate voice data and electronic data acoustically to the computer during a single communications session.

14. A device for communicating electronic data with a remote computer system, the device comprising:

means for receiving input information from a user and for producing data signals corresponding to the input information;

means for generating acoustical tones corresponding to the input information;

means for communicating said acoustical tones over an acoustical communications link to the remote computer, said acoustical communications link being capable of establishing a unidirectional or a bi-directional communications path between the device and said remote computer;

a receiving means for receiving data from the computer over a second communications link which is independent of the first communications link so that the remote unit receives data from the computer over two different communications links;

means in the remote unit for determining the length of time for the transmission of the acoustical data sent from the computer to the remote unit prior to the transmission of the acoustical data; and means for indicating the length of time of the acoustical data transmission.

15. The device of claim 14, wherein said acoustical communications means comprises means for receiving acknowledgment information over the acoustical communications link from the remote computer.

16. The device of claim 15, wherein said acknowledgment information comprises a voice prompt from the computer after the data has been transmitted to acknowledge receipt of the acoustical tones when a unidirectional acoustical communications path has been established between the device and the computer and wherein said acknowledgment information comprises acoustical tones that acknowledge receipt of the acoustical tones when a bi-directional acoustical communications path has been established between the device and the computer.

17. The device of claim 14, wherein the acoustical communications link comprises a telephone link and the second communications link comprises a wireless link, and the means for receiving data from the second communications link comprises a radio pager receiver.

18. The device of claim 14 further comprises means for receiving a request from the computer to resend the data packets.

19. The device of claim 14, wherein said remote unit comprises means, if the bi-directional communications path over the acoustical communications link has been established between the remote unit and the computer, for receiving acoustic tones over said acoustical communications link from the computer, the acoustical tones being adjusted for conditions of the acoustical communication link prior to transmission to the remote unit.

20. The device of claim 14, wherein said time length determining means comprises a preamble message that is transmitted from the computer to the remote unit prior to the transmission of message data, the preamble message containing a summary of the message data that is going to be transmitted to the remote unit and a time length for the message transmission.

21. The device of claim 14, wherein said transmission length indication means comprises means for indicating to the user of the remote unit the breaking of the acoustical communications link would not result in the loss of message data.

22. The device of claim 14, wherein said remote unit further comprises means for generating a command message that contains commands for the computer and preferences of the user, said command message being the first message transmitted to the computer when a communications link is established between the remote unit and the computer.

23. The device of claim 14, wherein said computer further comprises means for establishing a communications session between said remote unit and the computer over the acoustical communications link and means for switching between a plurality of different messaging sessions based on acoustical tones received during the communications session, said plurality of messaging sessions comprising an acoustical voice data session for receiving voicemail messages and an acoustical electronic data communications session for communicating acoustical electronic data between the remote unit and the computer so that the user may communicate voice data and electronic data acoustically to the computer during a single communications session.

24. A device for acoustically communicating electronic data with a remote computer, the device comprising:

a case having an open position and a closed position;

an input device, exposed when said case is in the open position, to permit a user to enter data into the device;

a display device, exposed when said case is in the open position, to display data;

a communications system for acoustically communicating electronic data with the computer during a communications session;

means for activating said communications system when said case is closed;

means in the remote unit for receiving a message indicating a total length of time to transmit messages to the remote unit during a communications session; and means, on the outer surface of the case, for indicating the time period of the communication session so that the user may initiate and complete the communications session with said case in the closed position.

25. A method for communicating between a remote unit and a computer, the method comprising:

receiving at the remote unit input information from a user and for producing data signals corresponding to the input information;

generating at the remote unit acoustical tones corresponding to the input information;

communicating said acoustical tones over an acoustical communications link to the computer, said acoustical communications link being capable of establishing a unidirectional or a bi-directional communications path between the device and said remote computer;

receiving data from the computer over a second communications link, which is independent of the first communications link so that the remote unit receives data from the computer over two different communications links;

determining the length of time for the transmission of the acoustical data sent from the computer to the remote unit prior to the transmission of the acoustical data; and indicating the length of time of the acoustical data transmission.

26. The method of claim 25, wherein said acoustical communications comprises receiving acknowledgment information over the acoustical communications link from the remote computer.

27. The method of claim 26, wherein said acknowledgment information comprises a voice prompt from the computer after the data has been transmitted to acknowledge receipt of the acoustical tones when a unidirectional acoustical communications path has been established between the device and the computer and wherein said acknowledgment information comprises acoustical tones that acknowledge receipt of the acoustical tones when a bi-directional acoustical communications path has been established between the device and the computer.

28. The method of claim 25, wherein the acoustical communications link comprises a telephone link, the second communications link comprises a wireless link, and the means for receiving data from the second communications link comprises a radio pager receiver.

29. The method of claim 25 further comprises receiving a request from the computer to resend the data packets.

30. The method of claim 25 further comprising receiving, if the bi-directional communications path has been established between the remote unit and the computer, acoustic tones over said acoustical communications link from the computer, the acoustical tones being adjusted for conditions of the acoustical communication link prior to transmission to the remote unit.

31. The method of claim 25, wherein said time length determining comprises using a preamble message that is transmitted from the computer to the remote unit prior to the transmission of additional messages, the preamble message containing a summary of each message that is going to be transmitted to the remote unit and a time length for each message transmission.

32. The method of claim 25, wherein said transmission length indication comprises indicating to the user of the remote unit when breaking of the acoustical communications link would not result in the loss of message data.

33. The method of claim 25 further comprising generating a command message that contains commands for the computer and preferences of the user, said command message being a first message transmitted to the computer when a communications link is established between the remote unit and the computer.

34. The method of claim 25 further comprising establishing a communications session between said remote unit and the computer over the acoustical communications link and switching between a plurality of different messaging sessions based on acoustical tones received during the communications session, said plurality of messaging sessions comprising an acoustical voice data session for receiving voicemail messages and an acoustical electronic data communications session for communicating acoustical electronic data between the remote unit and the computer so that the user may communicate voice data and electronic data acoustically to the computer during a single communications session.

* * * * *